United States Patent
Koyama et al.

(10) Patent No.: US 6,982,467 B2
(45) Date of Patent: Jan. 3, 2006

(54) SEMICONDUCTOR DEVICE AND METHOD OF MANUFACTURING THE SAME

(75) Inventors: Masato Koyama, Kanagawa-Ken (JP); Akira Nishiyama, Kanagawa-Ken (JP); Masamichi Suzuki, Kanagawa-Ken (JP); Yuuichi Kamimuta, Kanagawa-Ken (JP); Tsunehiro Ino, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/863,204

(22) Filed: Jun. 9, 2004

(65) Prior Publication Data

US 2005/0017305 A1 Jan. 27, 2005

(30) Foreign Application Priority Data

Jun. 13, 2003 (JP) .............................. 2003-169700

(51) Int. Cl.
*H01L 29/76* (2006.01)

(52) U.S. Cl. ....................... 257/388; 257/347; 257/351; 257/377; 257/384; 257/412; 257/413; 257/455; 257/456

(58) Field of Classification Search ................ 257/347, 257/351, 377, 384, 388, 412, 413, 455, 456
See application file for complete search history.

(56) References Cited

OTHER PUBLICATIONS

Samavedam, S. B. et al., "Metal Gate MOSFETs With $HfO_2$ Gate Dielectric", 2002 Symposium On VLSI Technology Digest of Technical Papers, pp. 24-25, (2002).
Park, D. G. et al., "Robust Ternary Metal Gate Electrodes for Dual gate CMOS Devices", IEDM, pp. 671-674, (2001).

*Primary Examiner*—Nathan J. Flynn
*Assistant Examiner*—Tan Tran
(74) *Attorney, Agent, or Firm*—Finnegan, Henderson, Farabow, Garrett & Dunner, L.L.P.

(57) ABSTRACT

A semiconductor device can be manufactured which has a low resistance, and device characteristics of which do not vary. The semiconductor device includes a silicon layer, a gate dielectric film formed on the silicon layer, a gate electrode formed on the gate dielectric film and including a nitrided metal silicide layer which is partially crystallized, and source and drain regions formed in a surface region of the silicon layer at both sides of the gate electrode.

16 Claims, 30 Drawing Sheets

EMBODIMENT

CONVENTIONAL DEVICE

CONVENTIONAL DEVICE

| | CONVENTIONAL METHOD AMORPHOUS STATE | THIS EMBODIMENT PARTIALLY CRYSTALLIZED STATE | CONVENTIONAL METHOD POLY-CRYSTALLINE STATE |
|---|---|---|---|
| SPECIFIC RESISTANCE | HIGH (NG) | LOW (OK) | LOW (OK) |
| ION PENETRATION | A LITTLE (OK) | A LITTLE (OK) | REMARKABLE (NG) |
| PROPERTY VARIANCE | A LITTLE (OK) | A LITTLE (OK) | GREAT (NG) |

FIG. 2

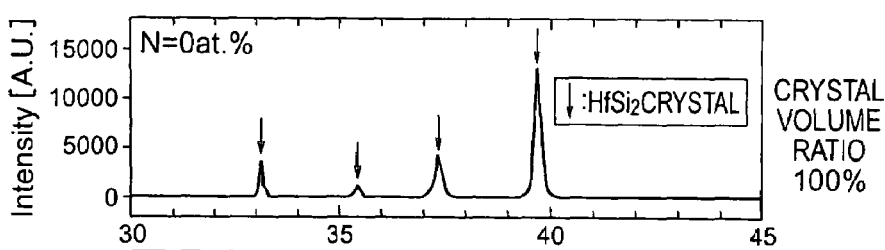
FIG. 3A NITROGEN CONTENT 0% — CRYSTAL VOLUME RATIO 100%
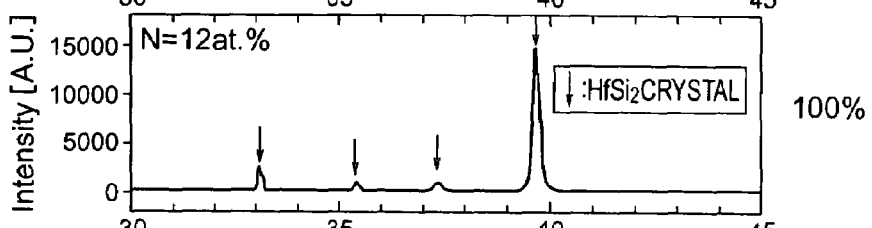
FIG. 3B 12at.% — 100%
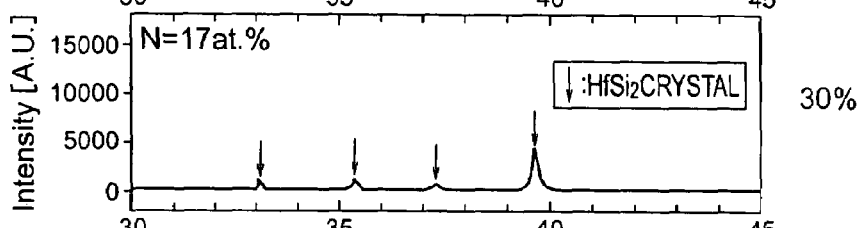
FIG. 3C 17at.% — 30%
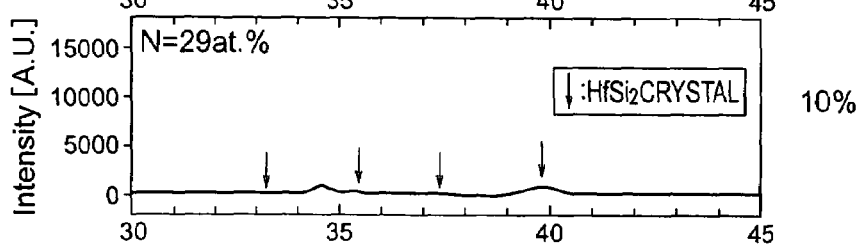
FIG. 3D 29at.% — 10%
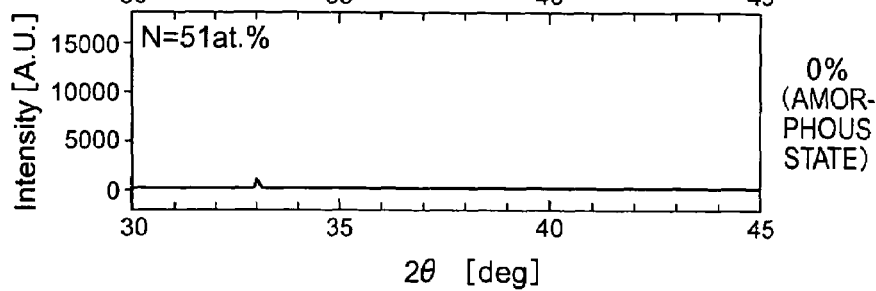
FIG. 3E 51at.% — 0% (AMORPHOUS STATE)
$2\theta$ [deg]

|  | MATERIAL | WORK FUNCTION |
|---|---|---|
| n-CHANNEL | Ti SILICIDE | <4.4eV |
|  | Zr SILICIDE | <4.3eV |
|  | Hf SILICIDE | <4.3eV |
| p-CHANNEL | Pt SILICIDE | >4.6eV |
|  | Pd SILICIDE | >4.6eV |
|  | Ir SILICIDE | >4.6eV |

FIG. 13

| NITROGEN CONTENT at.% | CRYSTAL VOLUME RATIO | SHEET RE-SISTANCE Ω/□ | BONDING STATE | WORK FUNCTION | SURFACE ROUGH-NESS |
|---|---|---|---|---|---|
| 0 | 100% | 1.5 | S | 4.3eV | NG |
| 12 | 100% | 1.2 | S | ↓ | NG |
| 17 | 30% | 1.7 | S+N | ↓ | OK |
| 29 | 10% | 4.6 | S+N | ↓ | OK |
| 51 | 0% | 2987 | N | ↓ | OK |

S : SILICIDE
N : NITRIDE

FIG. 16

SEMICONDUCTOR DEVICE AND METHOD OF MANUFACTURING THE SAME

CROSS-REFERENCE TO RELATED APPLICATION

This application is based upon and claims the benefit of priority from prior Japanese Patent Application No. 2003-169700, filed on Jun. 13, 2003, the entire contents of which are incorporated herein by reference.

BACKGROUND OF THE INVENTION

1. Field of the Invention

The present invention relates to a semiconductor device and a method of manufacturing a semiconductor device.

2. Background Art

When a CMOS (Complementary Metal-Oxide-Semiconductor) device in the submicron (0.1 $\mu$m) gate-length generation is manufactured, it is virtually impossible to use silicon (including an alloy with germanium, which will be referred to as "Si(Ge) gate" hereinafter), which has conventionally been used as a material of a gate electrode, in the same manner as before.

The first reason for this is that the resistivity of a Si(Ge) gate is high, i.e., a few hundreds $\mu\Omega$·cm. When an actual layer thickness is 100 nm, the sheet resistance value becomes a few tens $\Omega$/square. It is expected that in a semiconductor device of the submicron gate-length generation, an RC delay becomes evident with a resistivity of a gate electrode of 5 $\Omega$/square or more, thereby curbing the high-speed operation of the device.

The second reason is the problem of Si(Ge) gate electrode depletion. This is a phenomenon in which a depletion layer having a limited length extends at the silicon gate electrode side of an interface between a silicon gate electrode and a gate dielectric film since the solubility limit of a dopant impurity added to silicon is about $1\times10^{20}$ cm$^{-3}$.

The depletion layer substantially serves as a capacitance connected in series to the gate dielectric film. Accordingly, this depletion capacitance, which is about 0.3 nm when converted to a silicon oxide layer, is added to the gate dielectric film. A gate dielectric film of a future generation is required to have a gate capacitance of 1.5 nm or less calculated as the thickness of a silicon oxide layer. The addition of a capacitance of 0.3 nm caused by the gate depletion is deemed to serve as a factor that would strictly limit the formation of a thinner gate dielectric film.

The third reason is a problem in that an impurity such as boron, which is added to decrease the resistance of the Si(Ge) gate, is thermally diffused into a silicon substrate through the gate dielectric film during a high temperature heat treatment step in the manufacturing of an LSI. Such impurity can be a factor for variance in the threshold voltage of the FET, thereby considerably degrading the electric characteristics of the device. Since an LSI in a future generation is required to have a far thinner gate dielectric film, the problem of thermal diffusion of an impurity added to a Si(Ge) gate to a silicon substrate is expected to become more serious in the future.

In order to solve the problems of Si(Ge) gates, high melting point metals such as molybdenum, tungsten, tantalum, etc., and nitrides thereof are used to form a gate electrode. This is known as metal gate technology.

The resistivity of a metal gate is lower than that of a Si(Ge) gate. Accordingly, the problem of the RC delay can be considerably alleviated. Furthermore, since the free-electron concentration within a metal gate is two or more orders higher than that of a Si(Ge) gate, and the width of the gate depletion is decreased by one or more orders, the added capacitance, which is 0.3 nm (calculated as that of a silicon oxide layer) in the case of a Si(Ge) gate, can be decreased to a level that can be ignored in the case of a metal gate. Moreover, since it is not necessary to add an impurity to a metal gate in order to decrease the resistance, there is no problem of impurity penetration through a gate dielectric film. Thus, a metal gate is expected to solve the problems of a Si(Ge) gate.

When a CMOS device including a metal gate is formed, the so-called dual phi ($\phi$) metal gate technology is required, in which a metal material having a work function of p$^+$ silicon, and a metal material having a work function of n$^+$ silicon are used to form a p-channel MOSFET and an n-channel MOSFET, respectively. Using this technology, the threshold voltages of the p-channel MOSFET and the n-channel MOSFET can be completely controlled.

In the conventional art, TiN and TiAlN are proposed as a material for a metal gate of a p-channel MOSFET, and TaSiN is proposed as a material for a metal gate of an n-channel MOSFET (for example, D-G. Park, "IEDM", Tech. Digest (2001) p. 671, and S. B. Samavedam, "VLSI", Tech. Digest (2002) p. 24).

With such characteristics as having appropriate work functions, and being unmelted at a high temperature of about 900° C., thereby avoiding failures at an interface with a gate dielectric film, these materials are considered to be highly practical materials for forming a metal gate.

However, there are problems for these potentially practical materials. First, TiN and TiAlN are in a polycrystalline state. A gate electrode in a polycrystalline state would have the following problems.

The first problem is the mixing of an impurity into the lower part of a gate electrode during an ion implantation step. As a conventional way of manufacturing an LSI, ions are implanted to a processed gate electrode, thereby forming a source and a drain in a self-aligned manner with respect to the gate. However, when the gate electrode has a polycrystalline structure, accelerated ions pass through a grain boundary without scattering. Accordingly, the impurity is unintentionally introduced to a channel portion, thereby degrading characteristics of the device by varying the threshold voltage, etc.

The second problem is that since the grain size of the polycrystalline material forming the gate electrode is about the same as the device size, obviously a case may arise in which a gate electrode forming a single FET includes only a few crystal grains. In such a case, it is highly possible that variations in the number of crystal grains, the size thereof, and the crystal orientation thereof in the respective FETs may lead to variations in device characteristics.

On the other hand, TaSiN maintains an amorphous state even if it is subjected to high temperatures. This material can solve the aforementioned first and second problems involving polycrystalline material. However, there is a problem in that TaSiN in an amorphous state has extremely high resistivity. Generally, the resistance of a silicide can be decreased only when it is crystallized. Thus, the reason why the resistivity of TaSiN is high is this material is in an amorphous state.

As described above, a conventional Si(Ge) gate has such problems as a high resistivity leading to an RC delay, thereby curbing the high-speed operation of the device, the depletion of a Si(Ge) gate electrode leading to a loss of gate dielectric film capacitance, and the thresholds voltage varying due to the penetration of an impurity from the silicon gate electrode into the gate dielectric film.

Metal gate materials conventionally used to solve the aforementioned problems also have a dilemma in that ion penetration occurs with a low resistance material which is in a polycrystalline state, thereby varying the device characteristics, while an amorphous material cannot decrease the resistivity.

SUMMARY OF THE INVENTION

A semiconductor device according to a first aspect of the present invention includes: a silicon layer; a gate dielectric film formed on the silicon layer; a gate electrode formed on the gate dielectric film and including a nitrided metal silicide layer which is partially crystallized; and source and drain regions formed in a surface region of the silicon layer at both sides of the gate electrode.

A semiconductor device according to a second aspect of the present invention includes:

an n-channel MOSFET including: a p-type silicon layer formed on a first region of a semiconductor substrate; a first gate dielectric film formed on the p-type silicon layer; a first gate electrode formed on the first gate dielectric film and including a nitrided metal silicide layer which is partially crystallized; and n-type first source and drain regions formed in a surface region of the p-type silicon layer at both sides of the first gate electrode, and a p-channel MOSFET including: an n-type silicon layer formed on a second region of the semiconductor substrate; a second gate dielectric film formed on the n-type silicon layer; a second gate electrode formed on the second gate dielectric film and including a nitrided metal silicide layer which is partially crystallized; and p-type second source and drain regions formed in a surface region of the n-type silicon layer at both sides of the second gate electrode.

A method of manufacturing a semiconductor device according to a third aspect of the present invention includes: forming gate dielectric films in a region of a semiconductor substrate where a p-channel MOSFET is to be formed, and in a region of the semiconductor substrate where an n-channel MOSFET is to be formed; forming first gate electrode material layers of a partially crystallized nitrided metal silicide for forming a p-channel MOSFET on the gate dielectric films; forming a covering layer for covering only the first gate electrode material layer in the region where a p-channel MOSFET is to be formed; patterning the first gate electrode material layer in the region where an n-channel MOSFET is to be formed using the covering layer as a mask, leaving the first gate electrode material layer only in the region where a p-channel MOSFET is to be formed; forming a second gate electrode material layer of a partially crystallized nitrided metal silicide for forming an n-channel MOSFET on the gate dielectric film in the region where an n-channel MOSFET is to be formed; and removing the covering layer.

BRIEF DESCRIPTION OF THE DRAWINGS

FIG. 2 shows the differences in characteristics caused by the differences in structure between the metal gate electrode of the semiconductor device of the first embodiment and that of conventional semiconductor devices.

FIGS. 3A to 3E show XRD spectrums obtained from the study of the relationship between the crystal volume ratio and the nitrogen content of a nitrided metal silicide.

FIG. 13 shows nitrided metal silicide materials used to form the semiconductor device according to the first embodiment of the present invention, and their work functions.

FIG. 16 shows the performance of a gate electrode formed of a nitrided metal silicide used in the semiconductor device according to the first embodiment of the present invention and the dependence thereof on nitrogen content.

DESCRIPTION OF THE EMBODIMENTS

Hereinafter, embodiments of the present invention will be described in detail with reference to the accompanying drawings. It should be noted that the present invention is not limited to the following embodiments, and that additional modifications are possible.

(First Embodiment)

A semiconductor device according to the first embodiment of the present invention will be described below with reference to FIGS. 1 to 16.

The semiconductor device of this embodiment includes a MOSFET. The most remarkable feature of the present invention lies in that the MOSFET has a structure whereby the metal gate thereof is partially crystallized. In this specification, "partial crystallization" means that a layer includes crystallized portions and uncrystallized portions, and that the crystallized portions are substantially uniformly distributed in the layer.

The partially crystallized layer can solve the dilemma of the conventional metal gate materials, i.e, a polycrystalline material having a low resistance but having problems such as variance in characteristics, and an amorphous material solving the problems of the polycrystalline material but having a high resistance.

A metal gate electrode including a partially crystallized layer of the semiconductor device of this embodiment can be manufactured by using a nitrogen added metal silicide as a metal gate material.

Figure 1A:
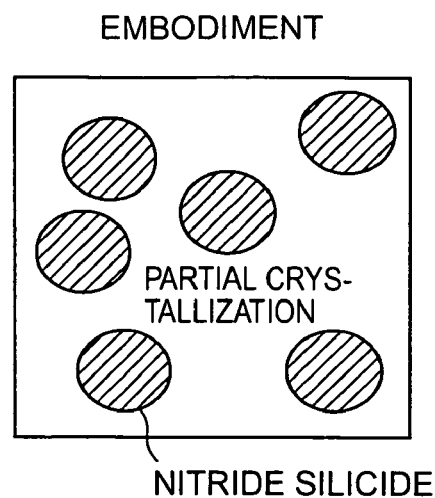
FIG. 1A is a schematic sectional view showing the structure of a metal gate electrode of a semiconductor device according to the first embodiment of the present invention.
Figure 1B:
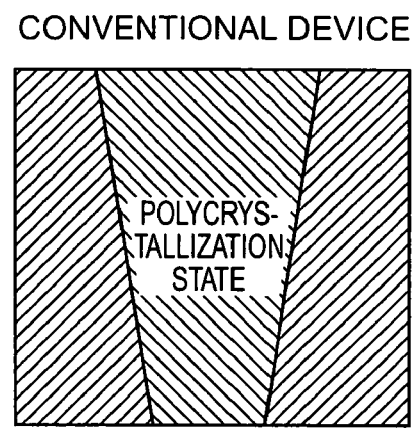
FIGS. 1B and 1C are schematic sectional views showing the structures of metal gates of conventional semiconductor devices.
Figure 1C:
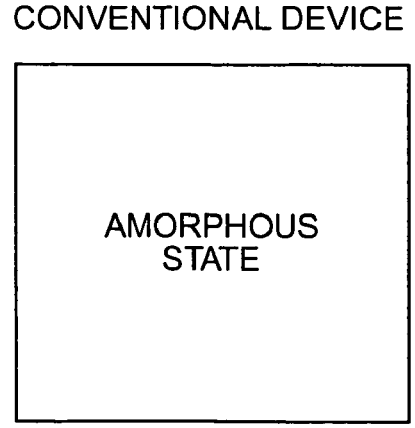

FIG. 1A shows the characteristics of the metal gate structure of the semiconductor device of this embodiment, FIGS. 1B and 1C show the characteristics of the metal gate structures of conventional semiconductor devices, and FIG. 2 shows the secondary characteristics resulting from the respective structures.

As can be understood from FIG. 1A, in the metal gate of this embodiment, a nitrogen added metal silicide (silicide nitride) is partially crystallized. That is to say, the portions in which the metal silicide is crystallized (shown as hatched portions) and the portions in which the metal silicide is not crystallized are mixed, and the crystallized portions are uniformly distributed. Accordingly, in this embodiment, grain boundaries do not continuously exist in the thickness direction of the metal gate, thereby solving the problem of ion penetration. Furthermore, since the size of crystal grains in the partial crystallization is smaller than that of the FET, the problem of variations in characteristics of FETs can be solved. In contrast with this, as shown in FIG. 1B, in the case where a polycrystalline material is used to form the metal gate of a semiconductor device, as conventionally performed, the grain boundaries continuously exist in the thickness direction of the metal gate, thereby causing a problem of ion penetration. In FIG. 1B, the crystal grains are marked by hatched lines. Moreover, in a metal gate having a polycrystalline structure, the number and size of crystal grains differ FET by FET. Accordingly, each FET has different characteristics. Furthermore, as shown in FIG. 1C, in the case where an amorphous material is used to form the metal gate of a semiconductor device, as conventionally performed, the amorphous layer has a high resistance since it is not crystallized.

However, in this embodiment, it is possible to decrease the resistivity of the entire layer since the crystallized portions decrease the resistivity. This embodiment has taken over the advantage of amorphous layers, i.e., having a high spatial uniformity, while overcoming the disadvantage of such layers, i.e., having a high resistance.

Hereinafter, hafnium will be used as an example of a material of a metal gate, and the concepts of this embodiment will be described based on the results of an experiment.

FIGS. 3A to 3E show the results of an experiment using the XRD (X-Ray Diffractometry), in which the changes in structure of a silicide layer were observed when nitrogen was added to hafnium silicide several times so as to change the nitrogen content in stages. FIG. 3A shows an experimental result when the nitrogen content was 0 at. %; FIG. 3B shows an experimental result when the nitrogen content was 12 at. %; FIG. 3C shows an experimental result when the nitrogen content was 17 at. %; FIG. 3D shows an experimental result when the nitrogen content was 29 at. %; and FIG. 3E shows an experimental result when the nitrogen content was 51 at. %. The measurement of the nitrogen content was performed using RBS (Rutherford Backscattering Spectrometry).

In FIGS. 3A to 3E, the horizontal axis represents the diffraction angle 2θ between the diffracted x-ray and the surface of the specimen, and the vertical axis represents the crystal diffraction intensity of the x-ray. The arrows in FIGS. 3A to 3D show hafnium silicide ($HfSi_2$) crystals. In these experiments, a heat treatment was performed at a temperature of 900° C. in order to crystallize the hafnium silicide thin film.

In the cases where the nitrogen content in the hafnium silicide layer was 0 at. % and 12 at. %, steep peaks of hafnium silicide were observed (FIGS. 3A and 3B). In the case where the nitrogen content in the hafnium silicide layer was 0 at. %, the hafnium silicide layer was 100% crystallized (FIG. 3A). This means that the volume ratio in the crystal region was 100%. In the case where the nitrogen content in the hafnium silicide layer was 12 at. %, the hafnium silicide layer was 100% crystallized (FIG. 3B). This means that the volume ratio in the crystal region (hereinafter also referred to as "crystal volume ratio") was 100%. It can be said that this layer was in a polycrystalline state. The volume ratio in the crystal region was obtained by dividing the volume of the crystal region by the sum of the volume of the crystal region and the volume of the amorphous region. The measurement of the volume ratio of the crystal region was performed using XRD. In FIGS. 3A to 3E, the maximum values of the crystal diffraction intensity of x-ray in the spectrums show the volume ratio in the crystal region.

It was clarified that when the nitrogen content increased to 17 at. % or more (FIG. 3C), the crystal diffraction intensity of the hafnium silicide layer decreased. This means that the volume ratio of the crystal contained in the layer decreased, thereby causing the partial crystallization. In the case where the nitrogen content was 12 at. % or less (FIG. 3B), the layer was 100% crystallized, while in the case where the nitrogen content was 17 at. %, the crystal volume ratio was 30% (FIG. 3C) and in the case where the nitrogen content was 29 at. %, the crystal volume ratio was 10% (FIG. 3D). Thus, as the nitrogen content increased, the crystal volume ratio decreased.

It was clarified that in the case where the nitrogen content was as high as 51 at. % (FIG. 3E), the hafnium silicide layer remained in an amorphous state after a heat treatment at a temperature of 900° C. This means that the hafnium silicide layer is still an amorphous layer.

The results of this experiment clarified that the partially crystallized metal gate structure as in the case of this embodiment could be achieved only by adding an appropriate amount of nitrogen to hafnium silicide. The mechanism of curbing the conversion into a polycrystalline state and advancing the partial crystallization by using nitrogen in this embodiment seems to be as follows.

In general, hafnium silicide contains embryos. When a heat treatment is performed, hafnium atoms and silicon atoms move within the hafnium silicide layer, resulting in that the embryos are supplied with such atoms, thereby causing nucleus growth. Ultimately, a large crystal grain of hafnium silicide is formed. Since the generation of embryos occurs spatially at several points, a plurality of hafnium silicide crystal grains are located in the layer in a close-packed manner, thereby completing the polycrystalline structure.

When nitrogen is added to the layer, the diffusion of atoms, which is necessary to perform the hafnium silicide nucleus growth, is curbed, thereby curbing the growth of crystal grains. At a nitrogen content which results in cessation of the crystal growth before the crystal grains come into contact with each other, the silicide layer is not in a polycrystalline state, but is in a partially crystallized state. When the nitrogen content is too high, the movement of atoms is completely interrupted, thereby inhibiting the growth of embryos, resulting in that the layer is in an amorphous state.

Figure 4:
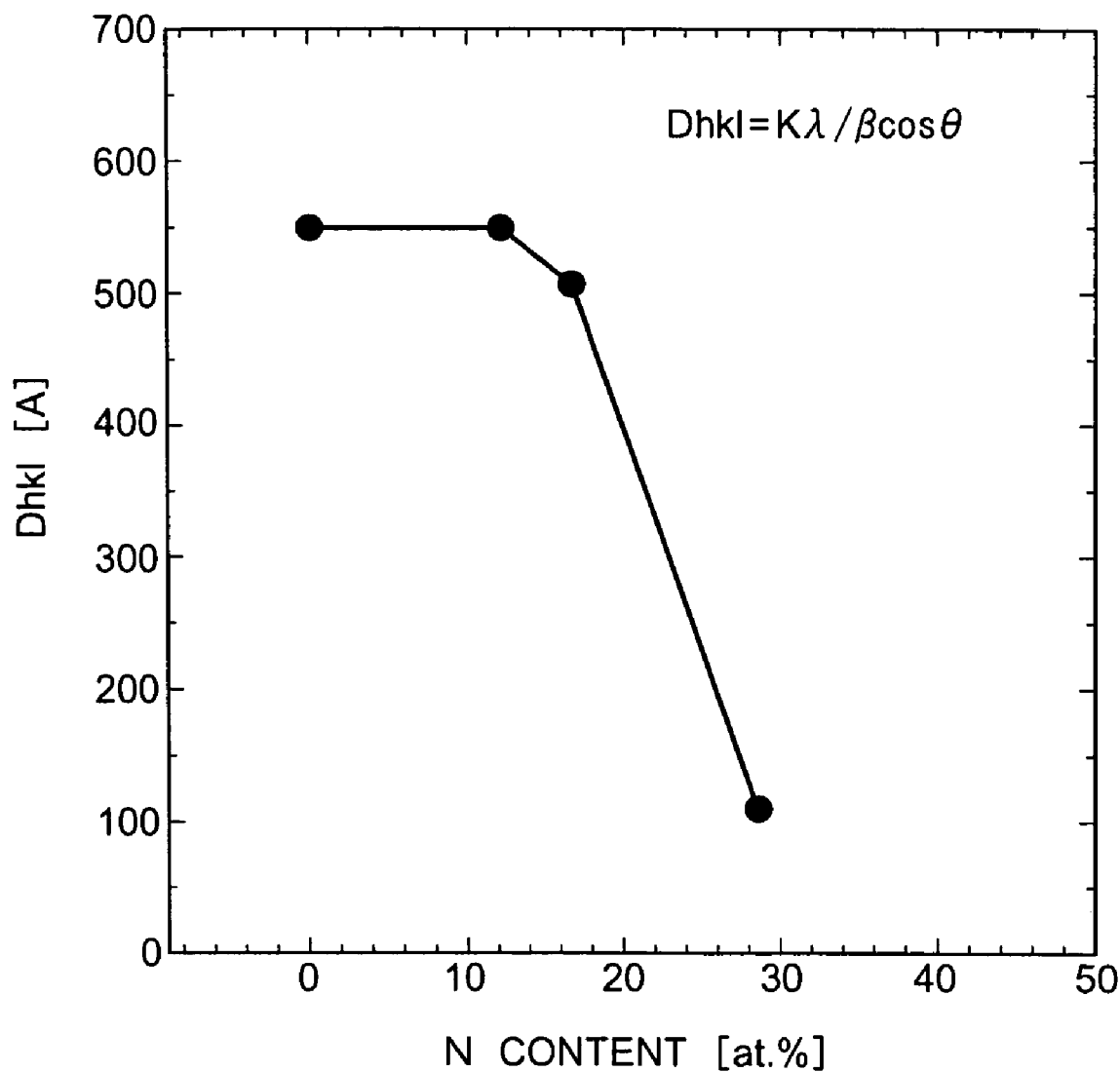
FIG. 4 shows the dependence of grain size of a nitrided metal silicide on nitrogen content.

FIG. 4 shows an experimental result proving that the addition of nitrogen inhibits the crystal nucleus growth. FIG. 4 shows the crystal grain size Dhkl of silicide in the silicide layer obtained from the half-width of the crystal diffraction peak of the XRD spectrums shown in FIGS. 3A to 3E. In FIG. 4, the horizontal axis represents the nitrogen content, and the vertical axis represents the silicide crystal grain size Dhkl in the silicide layer. When the nitrogen content was 12 at. % or less, with which no partial crystallization occured, the crystal grain size was constant. When the nitrogen content was 17 at. %, at which the partial crystallization started, the grain size decreased. When the nitrogen content was 29 at. %, at which the partial crystallization advanced further, the grain size became extremely small. It can be understood from these results that the addition of nitrogen inhibits the nucleus growth of hafnium silicide, which becomes more evident as the nitrogen content is increased.

Figure 5B:
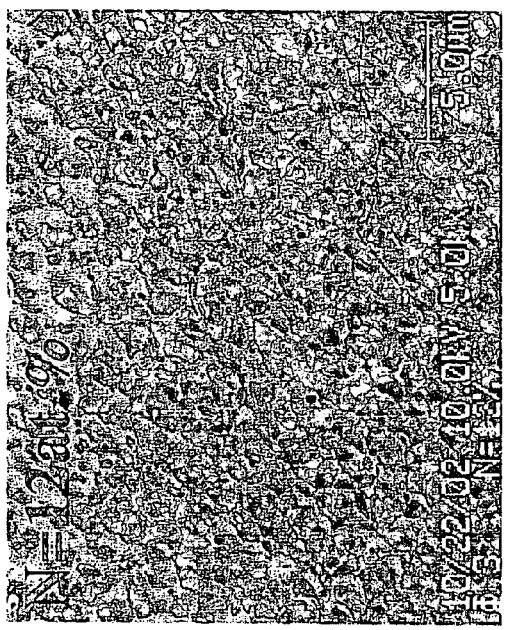
FIGS. 5A to 5D are SEM pictures taken during the study of influence of nitrogen content on the flatness of a surface of a nitride metal silicide.
Figure 5D:
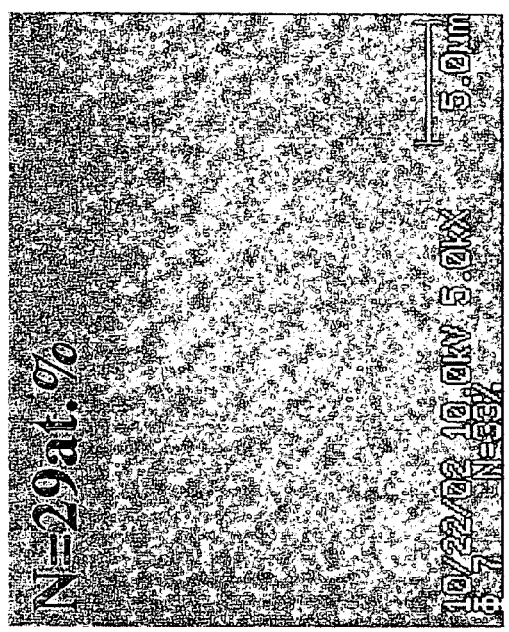
Figure 5A:
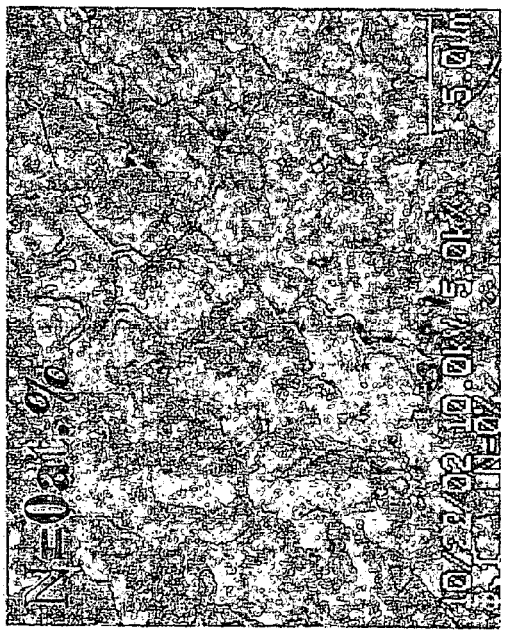
Figure 5C:
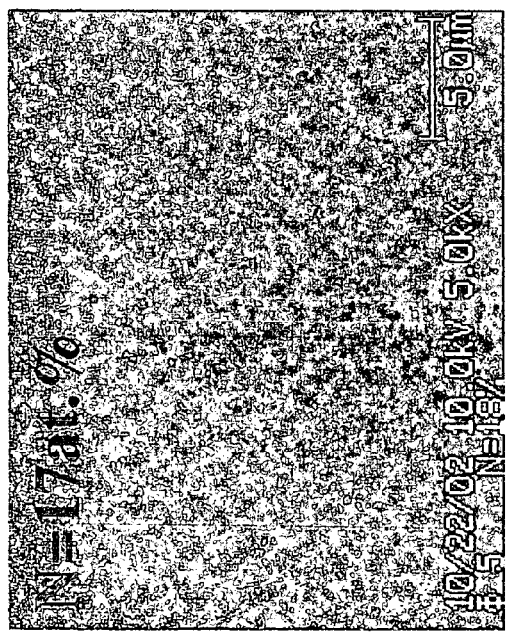

It was understood from the experiments that the downsizing of the crystal grains of hafnium silicide caused by the addition of nitrogen has advantages from the viewpoints of the improvement of oxidation resistant characteristic and the improvement of flatness of the metal gate electrode. FIGS. 5A to 5D are SEM (Scanning Electron Microscope) images of the surface of nitrogen added hafnium silicide layers having been subjected to a heat treatment at a temperature of 900° C. in an oxygen/nitrogen atmosphere. FIG. 5A shows an SEM image when the nitrogen content was 0 at. %; FIG. 5B shows an SEM image when the nitrogen content was 12 at. %; FIG. 5C shows an SEM image when the nitrogen content was 17 at. %; and FIG. 5D shows an SEM image when the nitrogen content was 29 at. %. When the nitrogen content was 12 at. % or less, the degree of surface roughness of the layer after a heat treatment at 900° C. was extremely high (FIGS. 5A and 5B). The first reason for this would be the expansion of projections and depressions on the surface of the layer due to the crystal growth of silicide, and the second reason would be that the oxidation of silicide caused the roughness of the surface.

When the nitrogen content was 17 at. % or more, the surface of silicide after being subjected to a heat treatment was extremely flat (FIGS. 5C and 5D). The first reason why such flatness could be achieved would be the effect of the crystal grain growth being inhibited, thereby making the grain size very small, and the second reason would be the oxidation of the layer being inhibited by the addition of nitrogen. The improvement in oxidation resistant property expands the degree of freedom in the LSI manufacturing process. That is to say, it is possible to set the oxygen control content to be high, thereby curbing the increase in resistance of the gate electrode. Further, when the surface is flat, the later steps can be facilitated, thereby decreasing variations in device characteristics.

Figure 6:
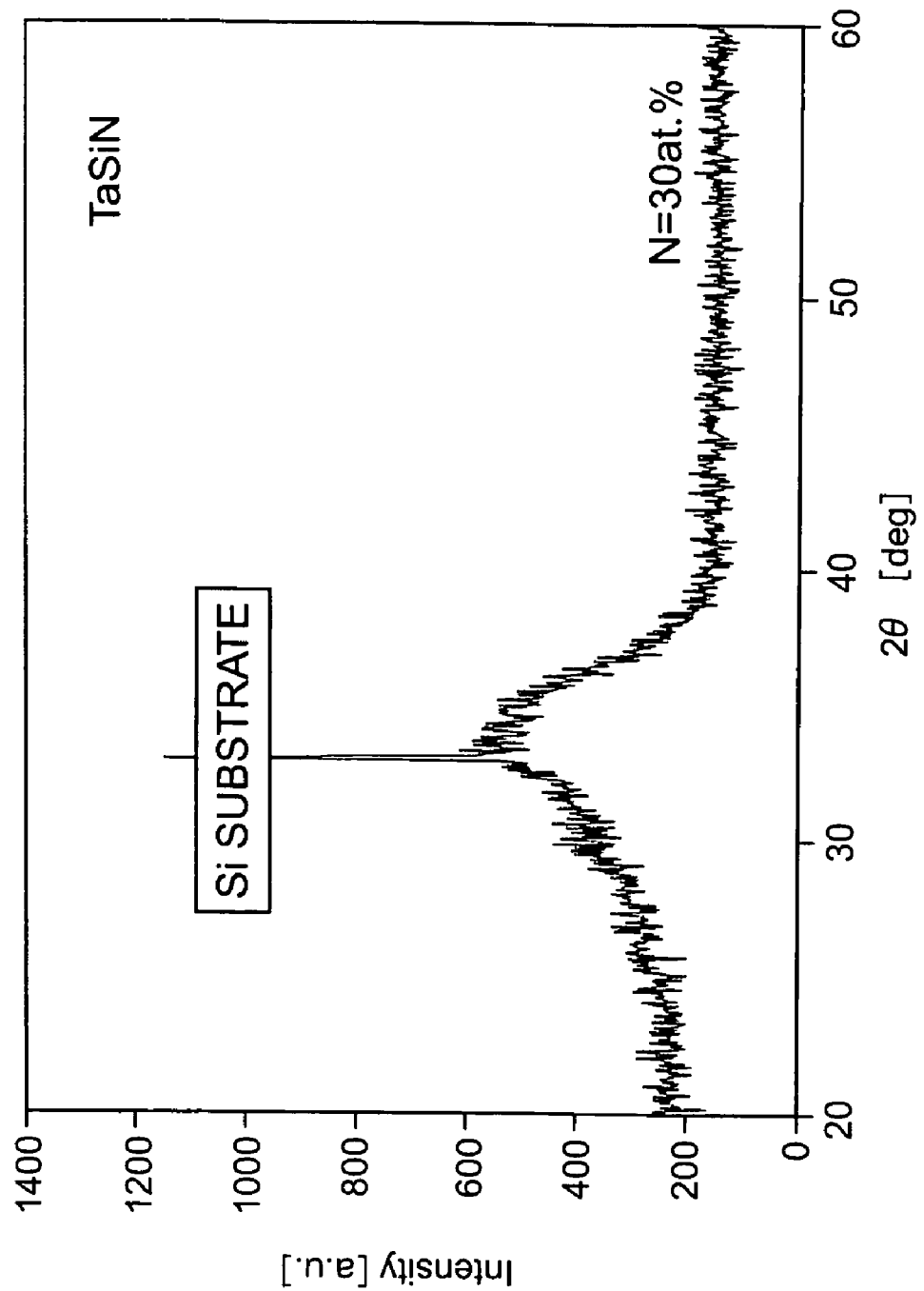
FIG. 6 shows an XRD spectrum obtained in the study of the crystallization behavior of TaSiN.

In order to achieve the partially crystallized metal gate of this embodiment, not only the range of nitrogen content but also the type of metal should be limited. As described previously, the limitation of diffusion of atoms using nitrogen plays an important role in the formation of a partially crystallized layer. Inherently, the diffusion of atoms does not occur easily with a high melting-point material. When nitrogen is added to such a material, no diffusion of atoms occurs. As a result, a high melting-point metal has a polycrystalline structure when no nitrogen is added thereto. The addition of only a slight amount of nitrogen makes the high melting-point metal convert to an amorphous structure. FIG. 6 shows an experimental result of XRD obtained in the study of the crystallization behavior of TaSiN using a high melting-point metal, Ta. When 30 at. % of nitrogen was added, no crystal peak was observed after a heat treatment at 900° C. This means that this layer was in an amorphous state. A similar experimental result is disclosed in S. B. Samavedam, "VLSI", Tech. Digest (2002), p. 24.

Figure 7:
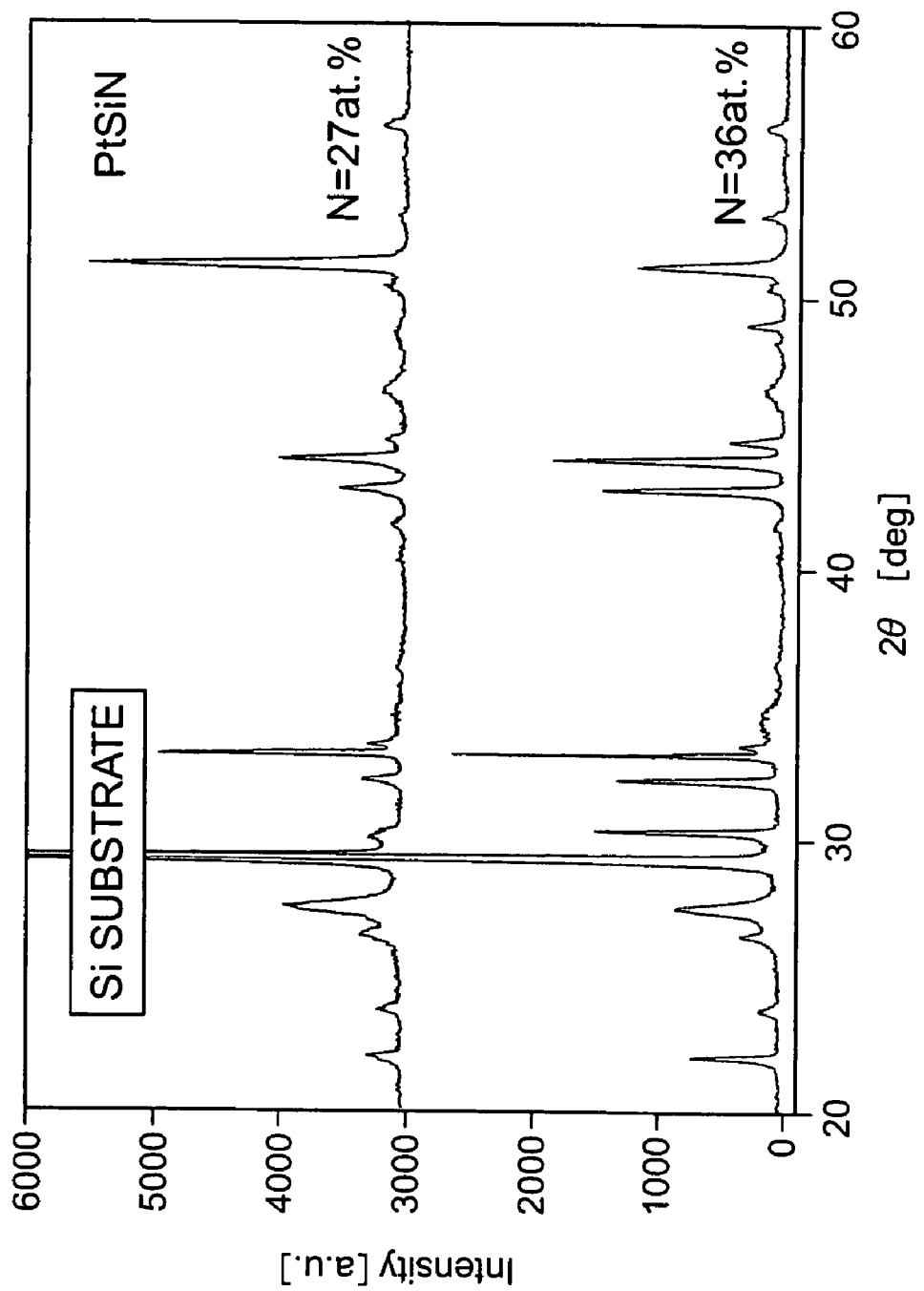
FIG. 7 shows an XRD spectrum obtained in the study of the structure of a nitrided metal silicide used in a semiconductor device of the first embodiment of the present invention after it is subjected to a heat treatment.

In the case of Hf, which has a lower melting point than Ta, a partially crystallized layer as shown in FIGS. 3A to 3E was achieved. FIG. 7 shows an experimental result of XRD using platinum, which has a lower meting point that Hf. It was understood from FIG. 7 that in this case, a partially crystallized nitrided metal silicide layer could be formed.

The structure of a metal silicide material having a melting point of 1,500° C. or less is destroyed during the process of manufacturing an LSI. A metal silicide material having a melting point of 2,500° C. or more converts to an amorphous state when nitrogen is added thereto. Such a metal silicide material cannot be partially crystallized. Accordingly, in this embodiment, the metal material used to form the gate electrode is limited to those having a melting point of 1,500° C. or more and 2,500° C. or less.

Figure 8:
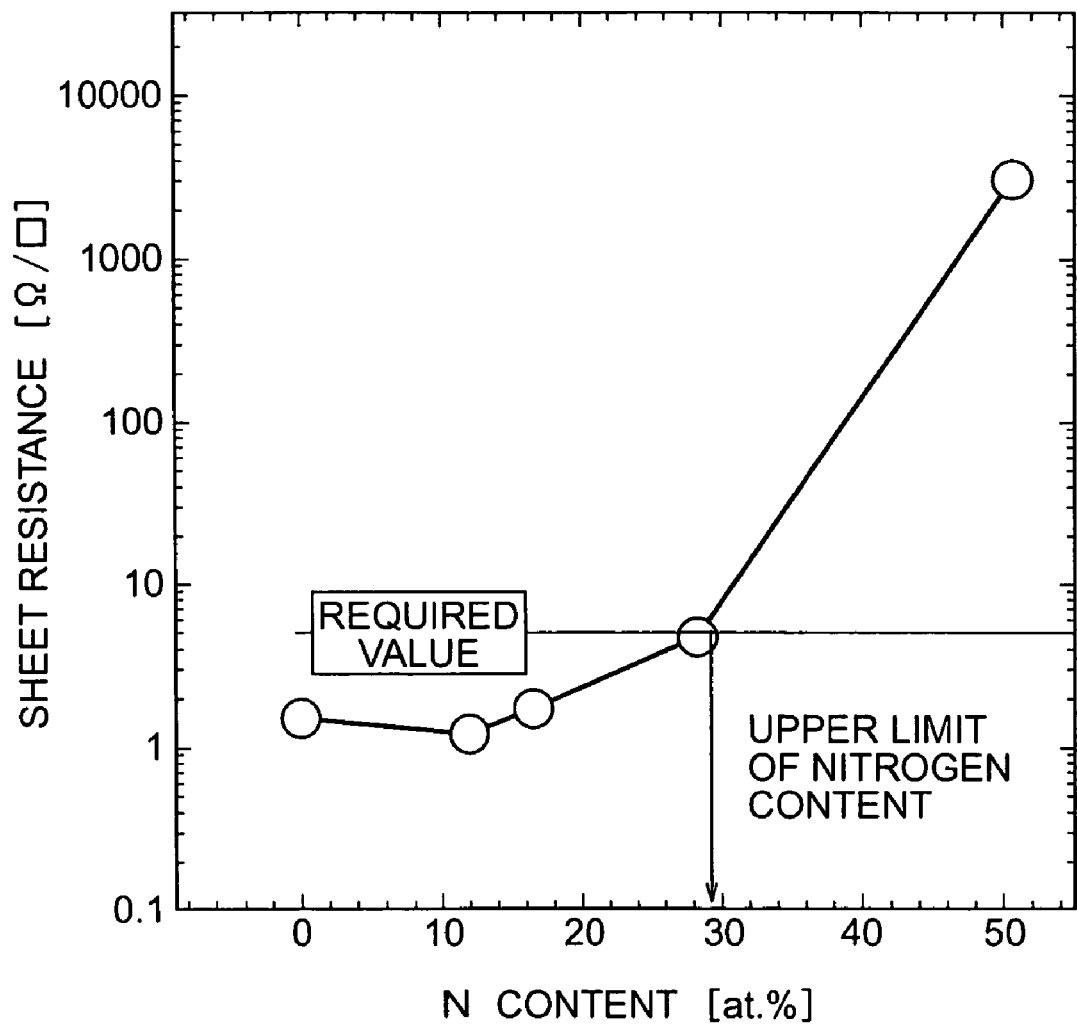
FIG. 8 shows the dependence on nitrogen content of sheet resistance of a nitrided metal silicide used to form a gate electrode of the semiconductor device according to the first embodiment of the present invention.

FIG. 8 shows the experimental result of measuring the resistivity of a hafnium silicide layer after being subjected to the annealing at 900° C., when the nitrogen content was 0 at. %, 12 at. %, 17 at. %, 29 at. %, and 51 at. %, as in the case of FIGS. 3A to 3E. In the cases where the nitrogen content of the partially crystallized metal silicide was 17 at. % and 29 at. %, the resistivity was lower than 5 Ω/square, which is the required performance of the layer. This means that this material can meet the requirement. As can be understood from FIG. 8, when the nitrogen content was 30 at. %, the resistivity became the required value, i.e., 5 Ω/square.

The reason why the resistance is kept low when the crystal volume ratio is 10%, as in the case where the nitrogen content was 29 at. %, is deemed to be that at least with this crystal volume ratio, the electrical conduction of the layer is highly dependent on the crystallized portions of the layer. When the crystal volume ratio is less than 10%, the resistance value no longer meets the required performance conditions. Accordingly, the crystal volume ratio of the nitrided metal silicide layer used to form the metal gate of this embodiment is limited to 10% or more. From the viewpoint of the decrease in the resistance value, there is no upper limit in crystal volume ratio. However, the lower limit of the nitrogen content for achieving both causing partial crystallization and avoiding such problems as the penetration of ions and the variations in device characteristics, i.e., 15 at. %, determines the upper limit of the crystal volume ratio to be 58%.

Figure 9:
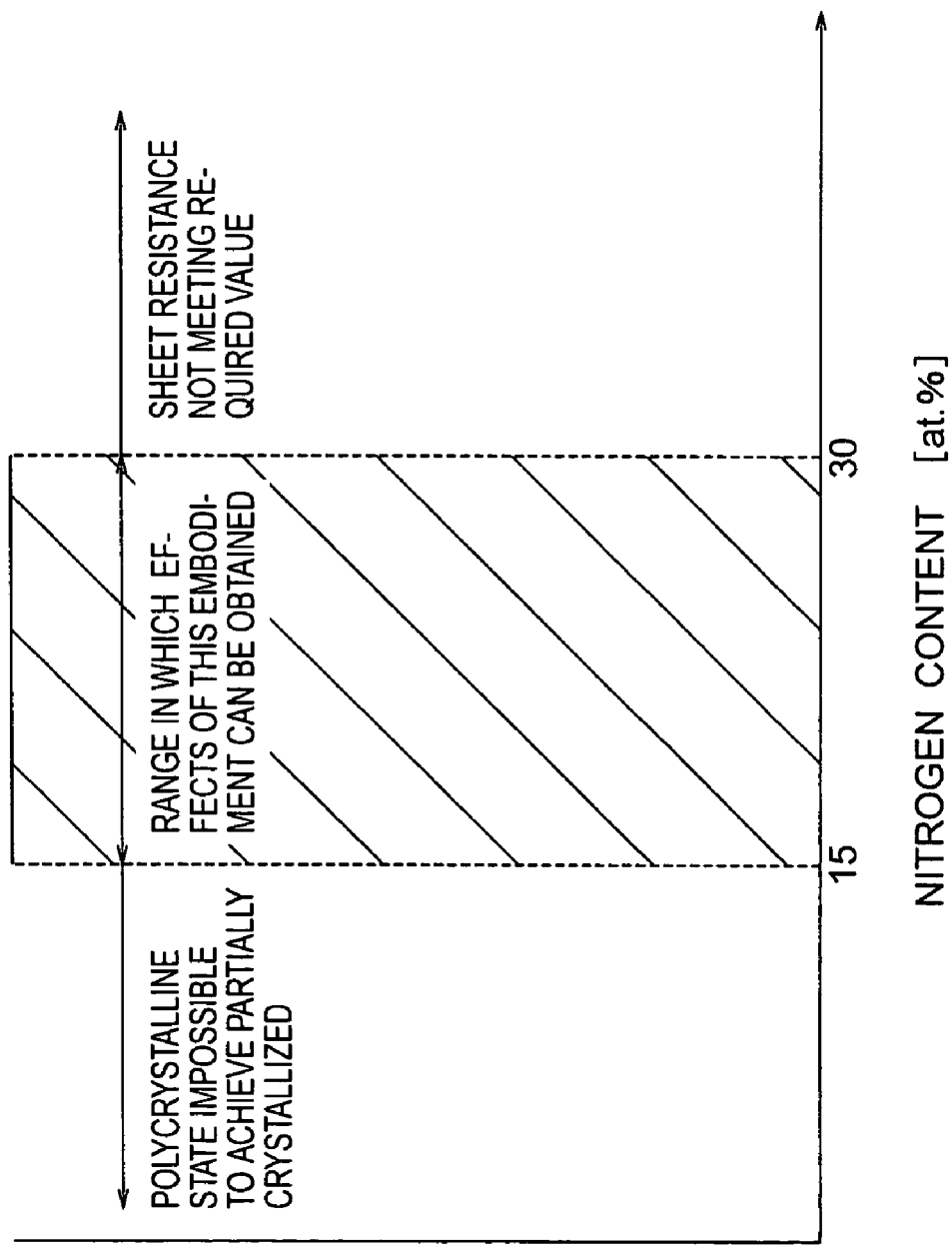
FIG. 9 shows the range of nitrogen content in a gate electrode of the semiconductor device of the first embodiment of the present invention, in which it is possible to obtain a desired effect.

Next, the reason why the range of nitrogen content to obtain the effects of this embodiment is 15 at. % to 30 at. % will be described with reference to FIG. 9. With respect to the upper limit of the nitrogen content, since the sheet resistance becomes higher than the required value when the nitrogen content is 30 at. % or more (FIG. 8), the nitrogen content in the nitrided metal silicide in the metal gate of this embodiment should be limited to 30 at. % or less, as shown in FIG. 9. With respect to the lower limit of the nitrogen content, as mentioned in the descriptions of the XRD experimental result shown in FIGS. 3A to 3E, no partially crystallized layer is formed when the nitrogen content is at 12 at. %, but a partially crystallized layer can be formed when the nitrogen content is 17 at. %. From an experiment in which the nitrogen content was changed in a precise fashion, it has become known that a partially crystallized layer can be formed only when the nitrogen content is 15 at. % or more. Therefore, in this embodiment, the nitrogen content of the nitrided metal silicide to form the metal gate should be limited to be 15 at. % or more, as shown in FIG. 9.

Figure 10:
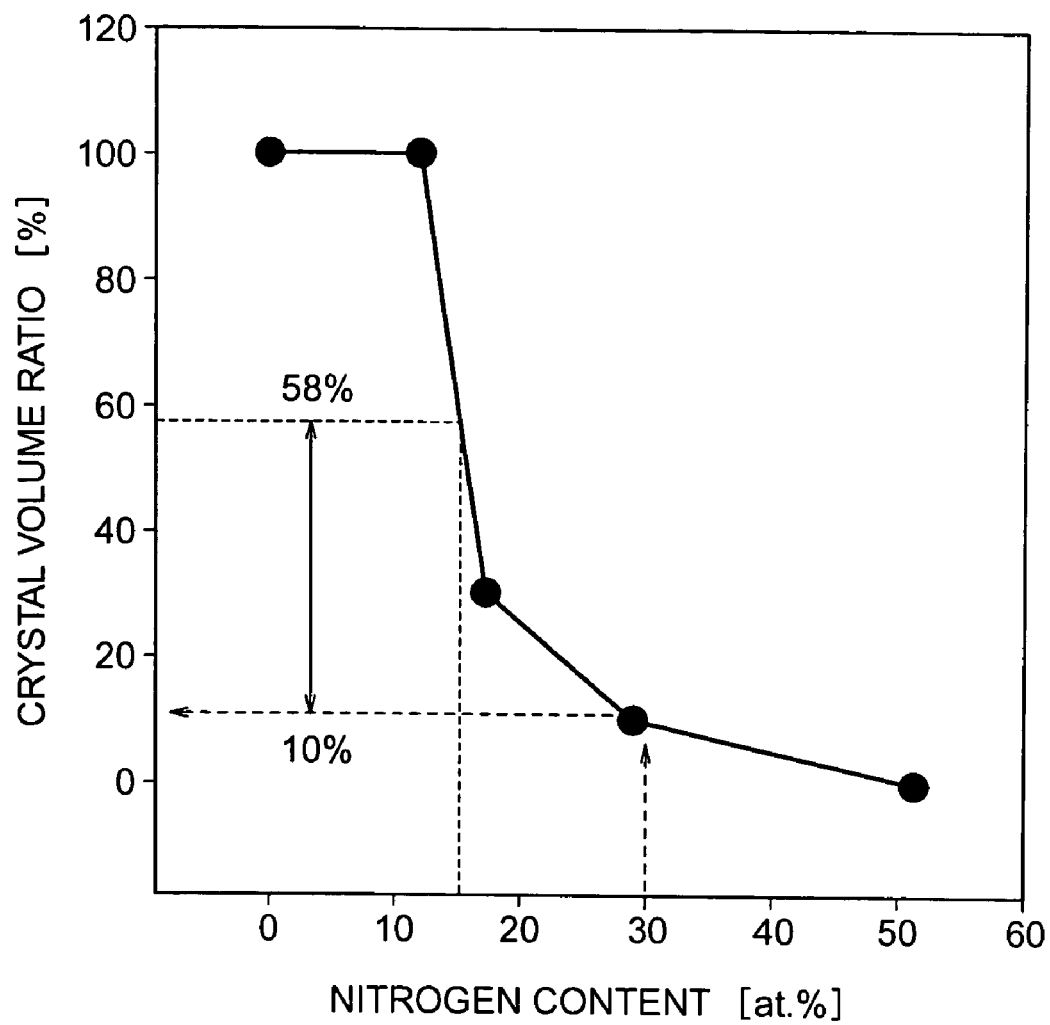
FIG. 10 shows the dependence on the nitrogen content of the crystal volume ratio of a nitrided metal silicide used to form a gate electrode of the semiconductor device according to the first embodiment of the present invention.

Thus, the range of the nitrogen content to obtain the effects of this embodiment is 15 at. % to 30 at. %. As can be understood from FIG. 10, it is preferable that the crystal volume ratio of the nitrided metal silicide in this range of nitrogen content be 10% to 58%. FIG. 10 plots the values of the crystal volume ratio (100%, 100%, 30%, 10% and 0%) when the nitrogen content in the metal silicide layer shown in FIG. 3 is 0 at. %, 12 at. %, 17 at. %, 29 at. %, and 51 at. %, respectively.

Figure 11:
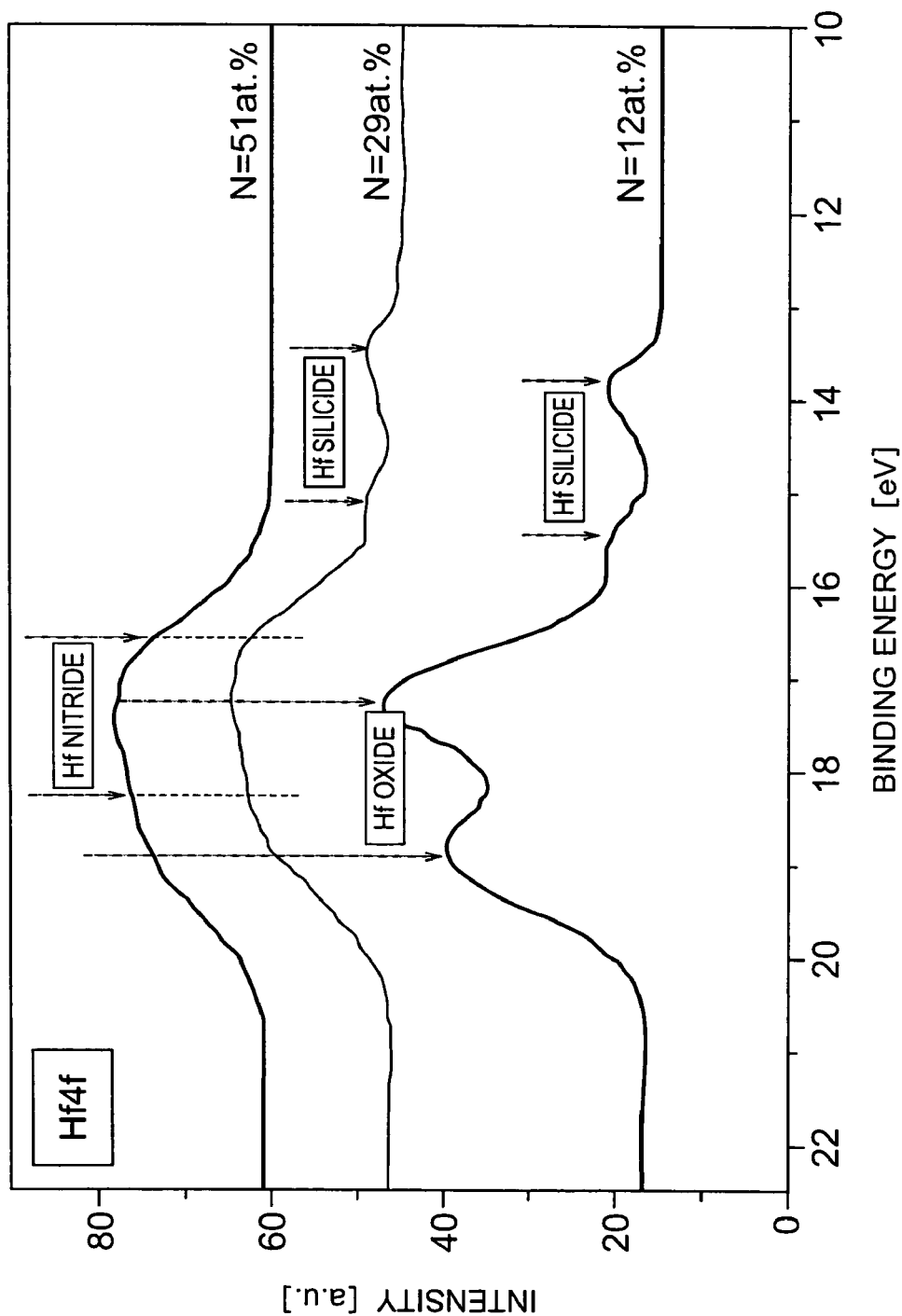
FIG. 11 shows XPS spectrums obtained in the study of atomic bond state after a heat treatment is performed on a nitrided metal silicide used to form the gate electrode of the semiconductor device according to the first embodiment of the present invention.

Getting back to FIG. 8, when the nitrogen content was 50 at. % or more, the resistance rapidly increased by two orders or more. The reason for this is deemed to be attributable to the layer structure becoming an amorphous state, as previously described. An experiment was performed to study other factors of the rapid increase by observing the changes from the viewpoint of the atomic bond using XPS (X-ray Photoelectron Spectroscopy). FIG. 11 shows the result of this experiment, i.e., the atomic bond states of hafnium nitride silicide (HfSiN) after being subjected to a heat treatment at 900° C. It was clarified that when the nitrogen content was 51 at. %, there was only a bonding state representing hafnium nitride within the layer. Since the surface of HfSiN was slightly oxidized in this experiment, the peak representing hafnium oxide was superimposed on the peak representing hafnium nitride thereby making the peak rather broad. When the nitrogen content was 29 at. %, the peaks representing hafnium silicide, in addition to the peaks representing hafnium nitride, as indicated by arrows, were observed. It was clarified that the reason why a rapid increase in the sheet resistance value occurred when the nitrogen content was 51 at. % was that there was no hafnium silicide bond in the layer.

FIG. 11 also shows the bonding state of HfSiN when the nitrogen content was 12 at. %. Also in this case, there are peaks representing hafnium silicide, indicating that the lowness of the sheet resistance value of HfSiN at a lower nitrogen content is attributed to this atomic bond. However, no peak representing hafnium nitride was observed for the HfSiN layer having a nitride content of 12 at. %, but only peaks representing hafnium oxide, generated by the surface oxidation of HfSiN, were observed. It seems that at this nitrogen content, nitrogen is preferentially bonded to silicon, and that as a result, no hafnium nitride is formed. Since hafnium nitride is less prone to being oxidized than hafnium silicide, the reason why the oxidation resistant property of HfSiN layer at the nitrogen content of 12 at. % degraded is deemed to be that a sufficient amount of hafnium nitride was not formed.

Figure 12:
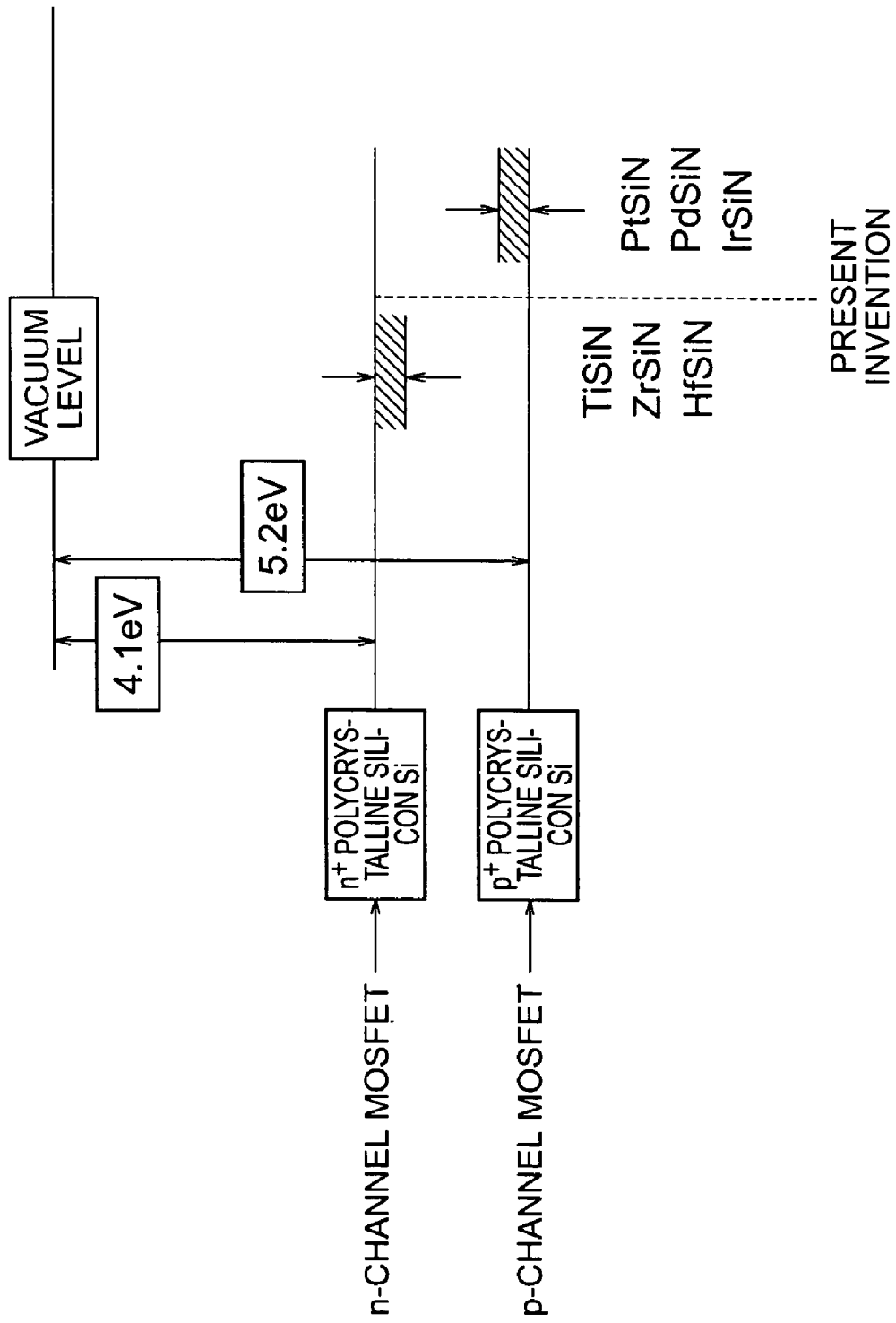
FIG. 12 schematically shows the work functions that should be met by electrode materials for forming CMOSFETs according to the first embodiment of the present invention, and indicates relative suitable materials.

The nitrided metal silicide used to form the metal gate of the semiconductor device according to this embodiment is effective to form a gate electrode of a CMOS device. As shown in FIG. 12, it is not possible to control the threshold voltage to be within an effective range if an electrode material having a work function near that of $n^+$ polycrystalline silicon is used with respect to an n-channel MOSFET, or an electrode material having a work function near that of $p^+$ polycrystalline silicon is used with respect to a p-channel MOSFET, as shown in FIG. 12. In this embodiment, it is possible to achieve the same performance as a conventional polycrystalline silicon gate electrode by using a nitrided metal silicide containing Ti, Zr, or Hf for a gate electrode of an n-channel MOSFET, or using a nitrided metal silicide containing Pt, Pd, or Ir for a gate electrode of a p-channel MOSFET. The reason for this is that the respective silicides have work functions near those of $n^+$ polycrystalline silicon and $p^+$ polycrystalline silicon, as shown in FIG. 13.

Figure 14:
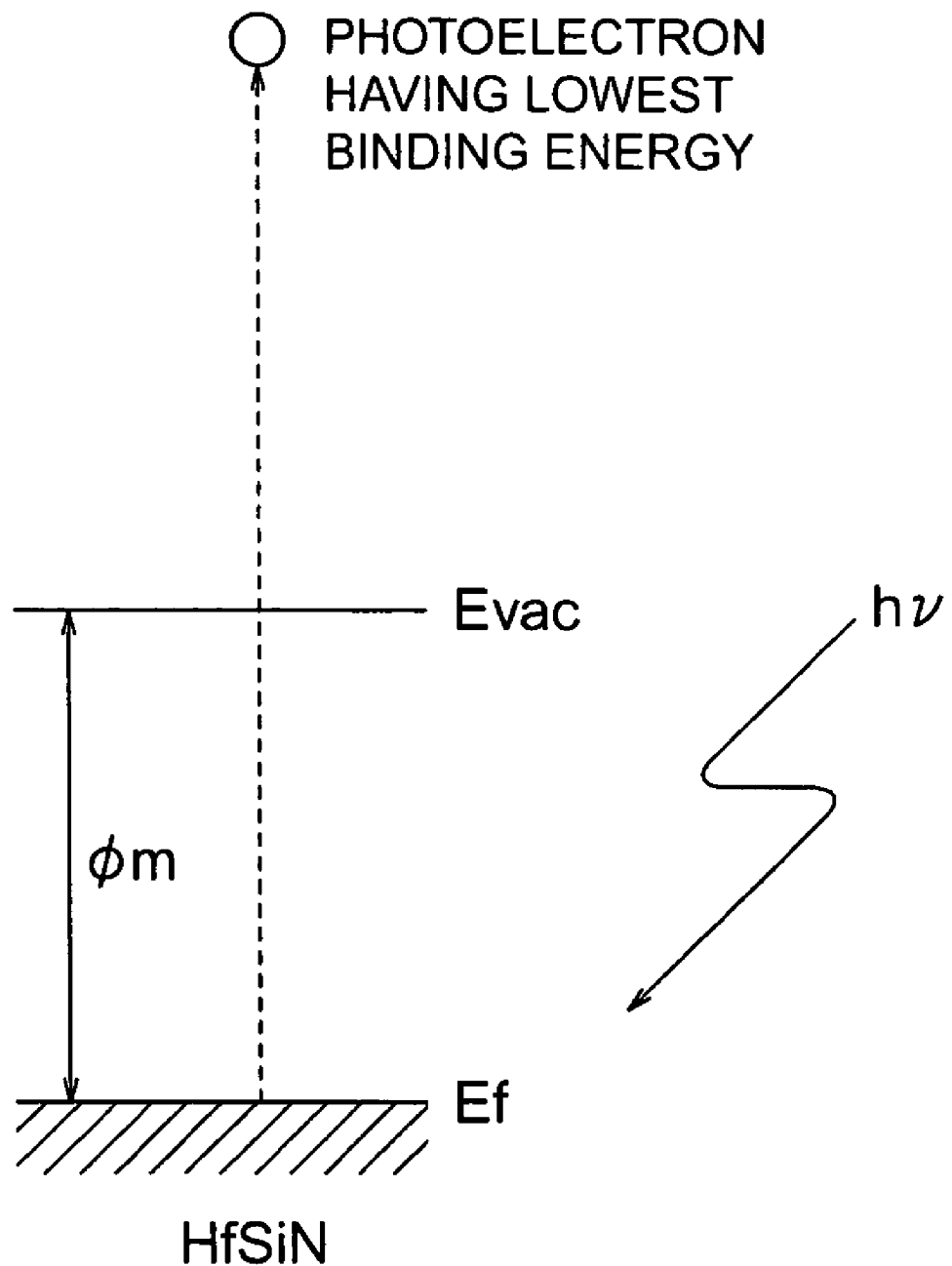
FIG. 14 schematically shows the binding energy of photoelectrons ejected from hafnium nitride silicide at the Fermi level.

It is known that when a metal silicide is nitrided, the work function thereof does not change considerably. Therefore, it is deemed that FIG. 13 can apply to a nitrided metal silicide. FIGS. 14 to 15B show the proofs thereof. FIG. 14 schematically shows the binding energy of photoelectrons ejected from hafnium nitride silicide at the Fermi level.

Figure 15A:
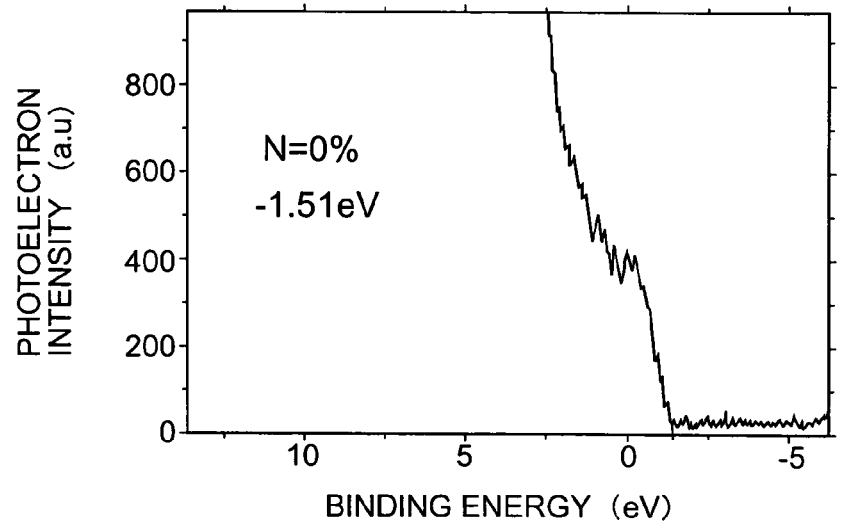
FIGS. 15A and 15B show XPS spectrums obtained in the study of change in work function of nitrided metal silicide used to form the semiconductor device according to the first embodiment of the present invention, caused by the addition of nitrogen.
Figure 15B:
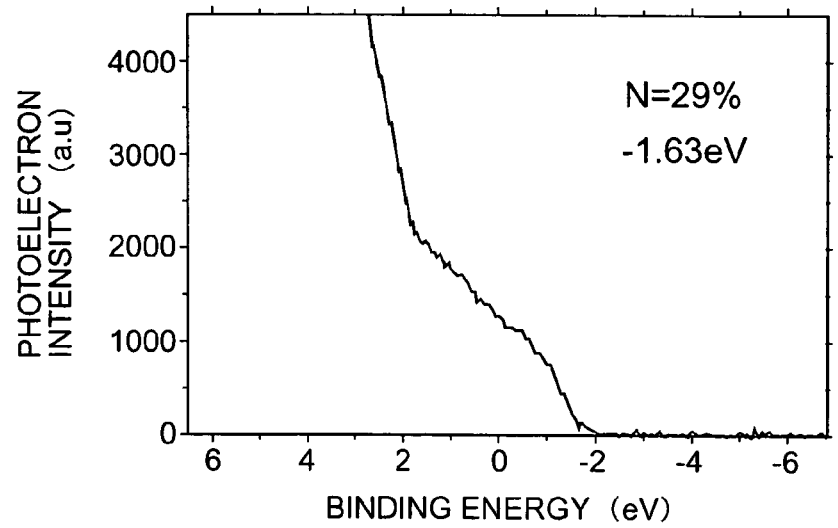

FIGS. 15A and 15B show experimental results of the study of whether the binding energy changes in accordance with the changes in nitrogen content in a hafnium nitride silicide layer formed by the use of XPS. FIG. 15A shows the case where the nitrogen content N was 0 at. %, and FIG. 15B shows the case where the nitrogen content N was 29 at. %.

As shown in FIG. 14, the work function $\phi_m$ is determined by the energy at the Fermi level Ef. Accordingly, it is possible to estimate the relative change of work function of different specimens in this experiment. As shown in FIGS. 15A and 15B, the binding energy of a Fermi level electron of hafnium silicide and a nitrided metal silicide (at the nitride content of 29 at %) were −1.51 eV and −1.63 eV, respectively. From this experimental result, it was revealed that there is no meaningful relative difference therebetween, i.e., a nitrided metal silicide has a work function similar to a metal silicide.

FIG. 16 shows the dependence of gate electrode performance on nitrogen content in the case where hafnium is used in a nitrogen added metal silicide used to form the metal gate of the semiconductor of this embodiment. As can be understood from FIG. 16 and the previous descriptions, the range of nitrogen content in which the partially crystallized metal gate of this embodiment is superior in performance and can show more advantageous effects than a conventional device is 15 at. % or more and 30 at. % or less.

As described above, according to this embodiment, it is possible to manufacture a semiconductor device which has a lower resistance, the device characteristics of which do not vary.

(Second Embodiment)

Next, a method of manufacturing a semiconductor device according to the second embodiment of the present invention will be described with reference to FIGS. 17 to 29. The semiconductor device manufactured by this method is a CMOS device, in which metal gates of the first embodiment are used to form the gate electrodes of an n-channel MOSFET and a p-channel MOSFET.

Figure 17:
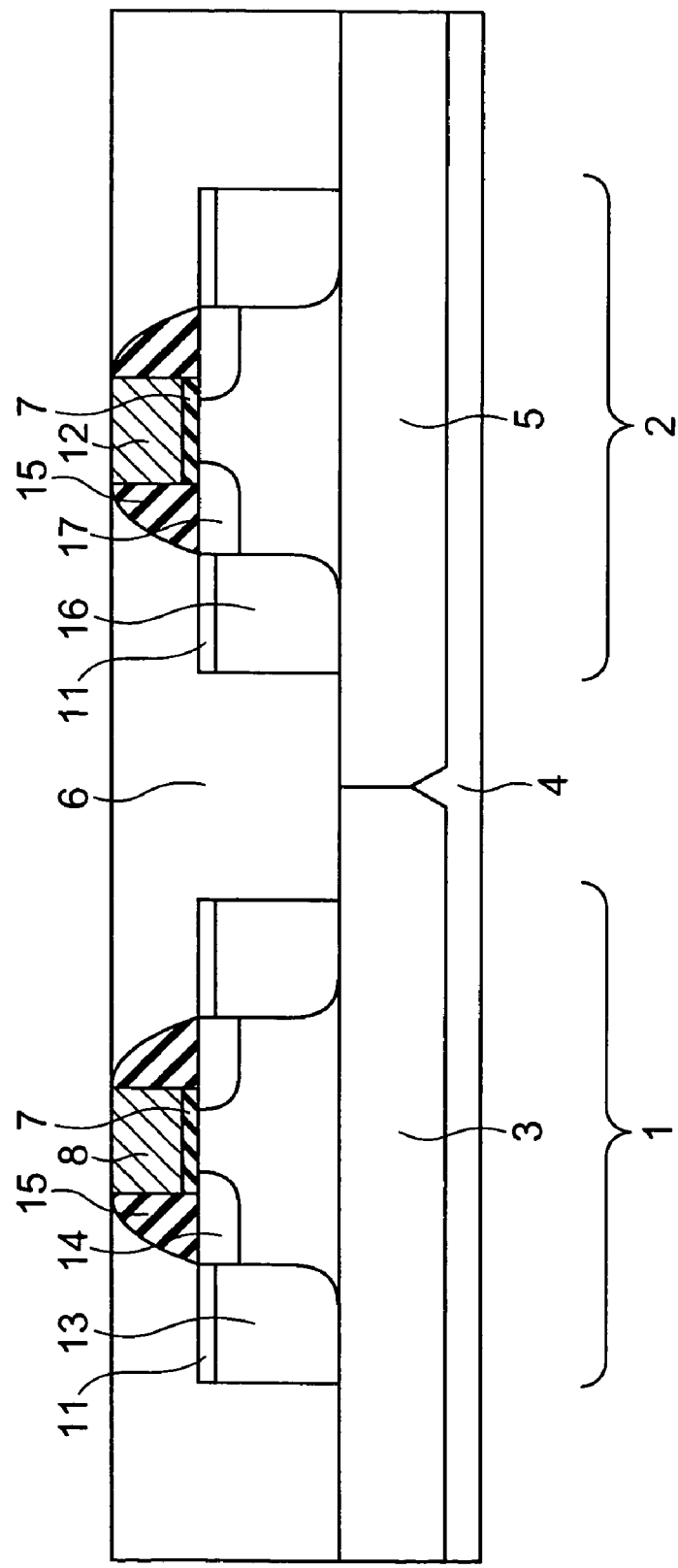
FIG. 17 is a sectional view showing a CMOS device manufactured according to the second embodiment of the present invention.

FIG. 17 is a sectional view showing the structure of a CMOS device manufactured by the manufacturing method of this embodiment. In this CMOS device, a p-channel MOSFET 1 and an n-channel MOSFET 2 are formed on the same substrate. As shown in FIG. 17, the p-channel MOSFET 1 and the n-channel MOSFET 2 are formed on the silicon substrate 4, and isolated by an element isolation region 6 having a shallow trench structure.

In a region of the silicon substrate 4 where the p-channel MOSFET 1 is formed, an N silicon well 3 is formed, while in a region where the n-channel MOSFET 2 is formed, a P silicon well 5 is formed.

The p-channel MOSFET 1 includes a laminated structure (MIS structure) having a gate dielectric film 7 formed on the N silicon well 3 and a p-channel nitrided metal silicide gate electrode 8. The p-channel nitrided metal silicide gate electrode 8 is formed by using any of the metals Pt, Pd, and Ir. At the side of this laminated structure, a gate sidewall 15 is formed.

Deep p$^+$ impurity diffusion layers 13 and shallow p$^+$ impurity diffusion layers 14 are formed in the N silicon well 3 at both sides of the gate dielectric film 7. These layers serve as a source and a drain. A self-aligned silicide (salicide) layer 11 is formed on the deep p$^+$ impurity diffusion layers 13.

In a region where the n-channel MOSFET 2 is formed, the P silicon well 5 is formed. The n-channel MOSFET 2 includes a gate dielectric film 7 formed on the P silicon well 5, and an n-channel nitrided metal silicide gate electrode 12 formed by using any of the metals Ti, Zr, and Hf. At the side of this laminated structure, a gate sidewall 15 is formed.

Deep n$^+$ impurity diffusion layers 16 and shallow n$^+$ impurity diffusion layers 17 are formed in the P silicon well 5 at both sides of the gate dielectric film 7. These layers serve as a source and a drain. A salicide layer 11 is formed on the deep n$^+$ impurity diffusion layers 16.

A method of manufacturing the CMOS device shown in FIG. 17 will be described below with reference to FIGS. 18 to 27.

Figure 18:
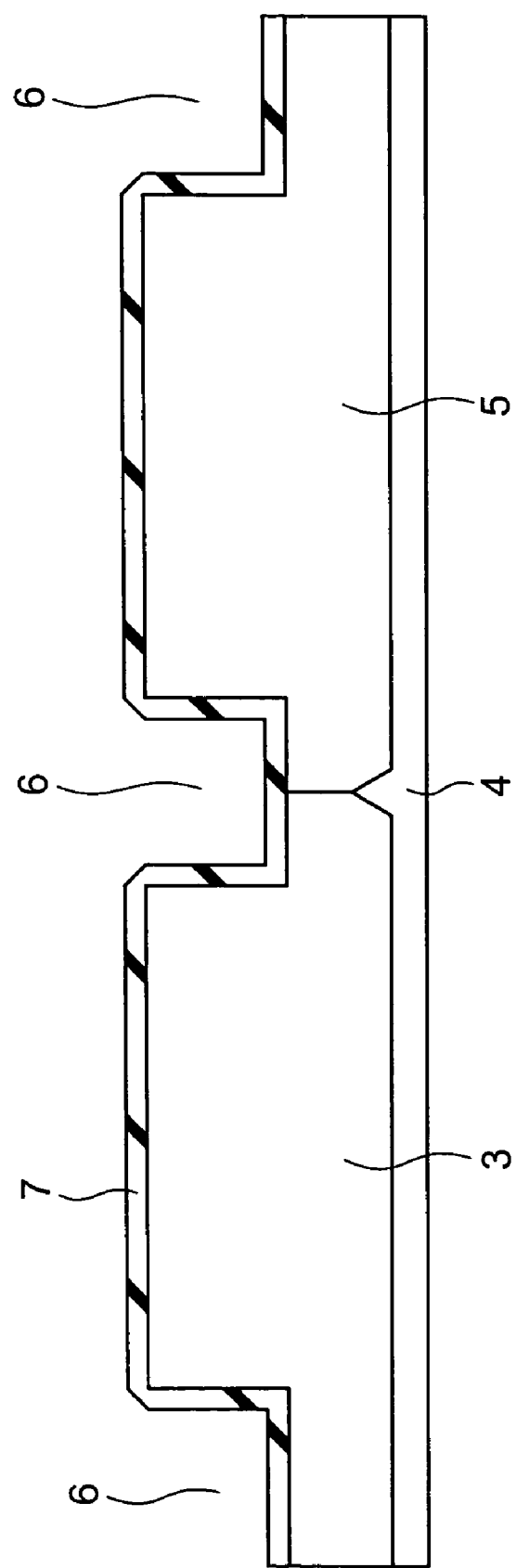
FIG. 18 is a sectional view showing a step of a method of manufacturing a CMOS device according to the second embodiment of the present invention.

First, as shown in FIG. 18, the element isolation region 6 having a shallow trench structure is formed on the silicon substrate 4. After the N silicon well 3 and the P silicon well 5 are formed, the gate dielectric film 7, which is any of a silicon oxide ($SiO_2$) layer, a silicon oxynitride (SiON) layer, a metal oxide layer, and a metal silicate layer, is formed. In the case of a metal oxide layer, at least one metal selected from the group of zirconium, hafnium, titanium, tantalum, aluminum, and a rare-earth element such as yttrium, lanthanum, cerium, etc., can be used. It is preferable that a CVD method be used to form such a layer since the step coverage property is high, and the damage to the silicon layer is slight. However, a sputtering method or an MBE method can also be used to obtain the effects of the present invention.

Figure 19:
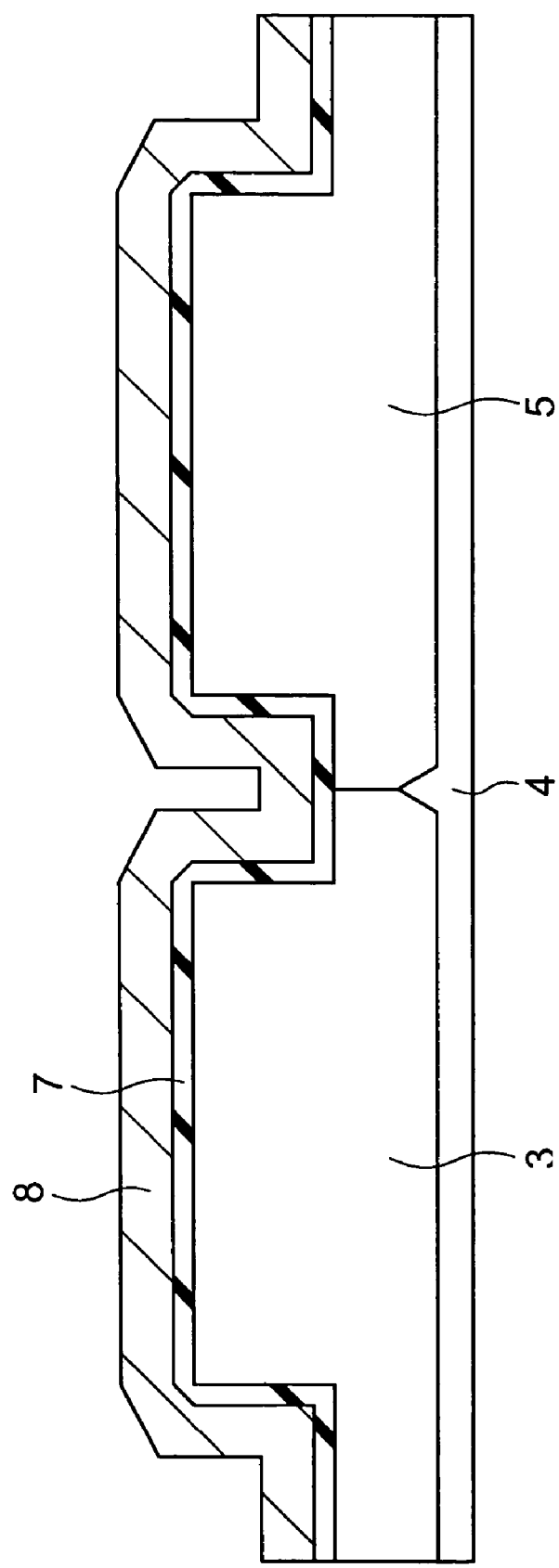
FIG. 19 is a sectional view showing a step of the method of manufacturing a CMOS device according to the second embodiment of the present invention.

Next, as shown in FIG. 19, the p-channel nitrided metal silicide gate electrode 8 is deposited on the entire surface of the gate dielectric film 7. For example, a PtSiN layer having a thickness of 100 nm can be deposited. The deposition of the PtSiN layer can be formed by performing simultaneous sputtering from a Pt target and a Si target. It is possible to set the nitrogen content in the PtSiN layer to be about 20% by using Ar/$N_2$ mixture gas at the time of the sputtering and by setting the Ar/$N_2$ gas flow ratio to be about 9 to 1. In this embodiment, the Ar flow rate is set to be 89 sccm, and the $N_2$ flow rate is set to be 9 sccm, and the sputtering power is set to be 100 W for Pt, and 250 W for Si, thereby depositing a PtSiN layer having a Pt/Si ratio of 1 to 1, and a nitrogen content of 20 at. %. It is possible to adjust the Pt:Si ratio by adjusting the sputtering power. In this embodiment, it is preferable that the Pt:Si ratio be about 1:1 to 3:5, since with this ratio, the composition of a Pt silicide in PtSiN becomes either PtSi or $Pt_2Si$, thereby decreasing the resistance further. The materials of the p-channel nitrided metal silicide that can be used in this invention, i.e., Pt, Pd, and Ir, are classified as noble metals in the periodic table of elements, and have substantially the same solid-state properties from a chemical viewpoint. Accordingly, it is possible to form the p-channel nitrided metal silicide gate electrode 8 by using Pd and Ir in a manner similar to that described above.

Figure 20:
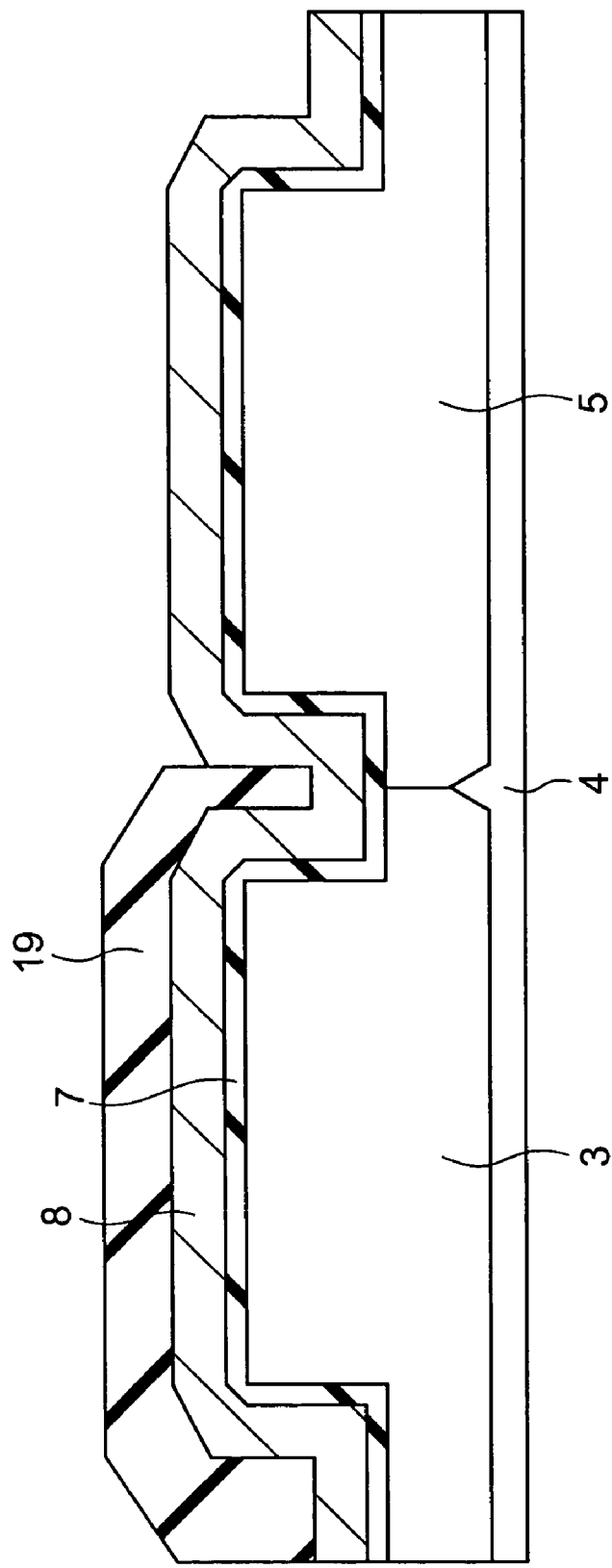
FIG. 20 is a sectional view showing a step of the method of manufacturing a CMOS device according to the second embodiment of the present invention.
Figure 21:
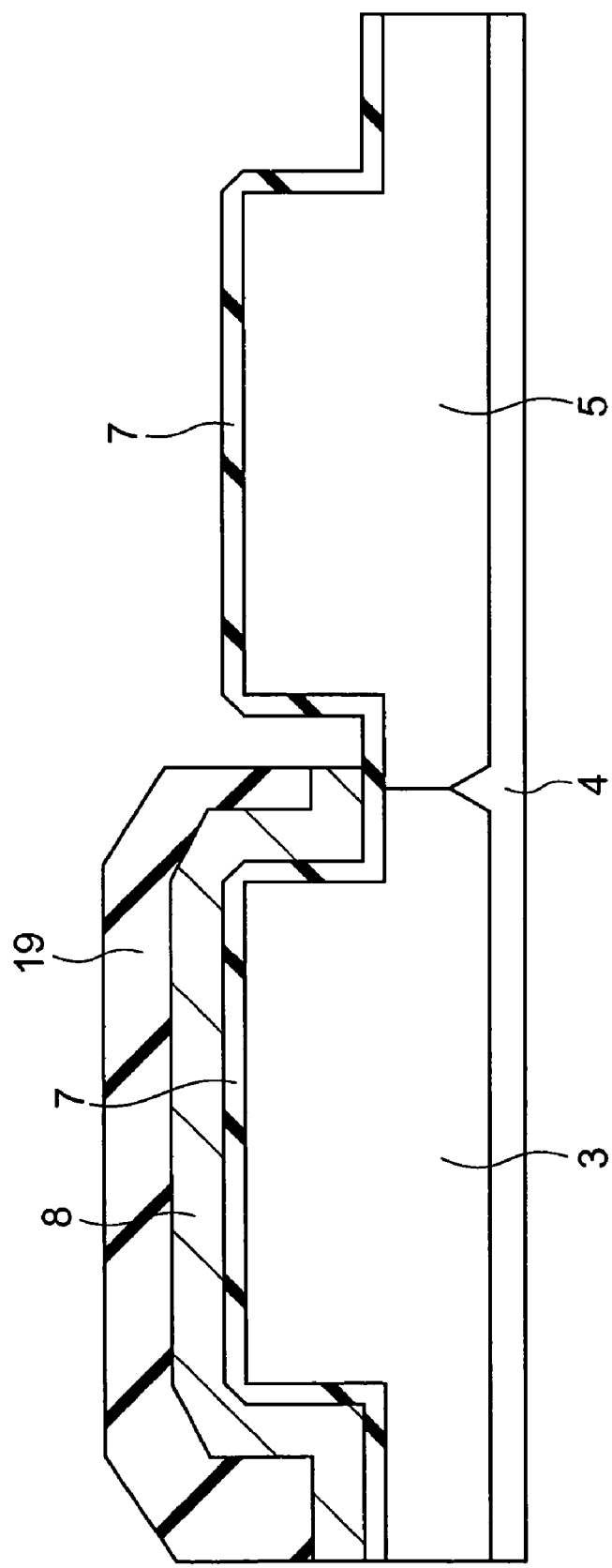
FIG. 21 is a sectional view showing a step of the method of manufacturing a CMOS device according to the second embodiment of the present invention.

Next, as shown in FIG. 20, a mask layer 19 for covering only the p-channel MOSFET 1 is formed. In this embodiment, a $Si_3N_4$ layer 19 is formed by first depositing the $Si_3N_4$ layer 19 on the entire surface of the structure shown in FIG. 19 by using a CVD method, etc., forming a resist mask (not shown in the drawing) on the p-channel MOSFET 1 by a normal lithography technique, and then removing the portion of the $Si_3N_4$ layer 19 that is not covered by the resist mask by heated phosphoric acid solution, thereby obtaining the structure shown in FIG. 20.

Next, the portion of the PtSiN layer 8 that is not covered by the $Si_3N_4$ mask layer 19 is removed. In this step, first the silicon oxide layer formed at the uppermost portion of the PtSiN layer 8 is removed by HF solution, and then, the PtSiN layer 8 is removed by aqua regia treatment, thereby obtaining the structure shown in FIG. 21. At this time, the gate dielectric film 7 deposited on the portion of the n-channel MOSFET 2 is not etched.

Figure 22:
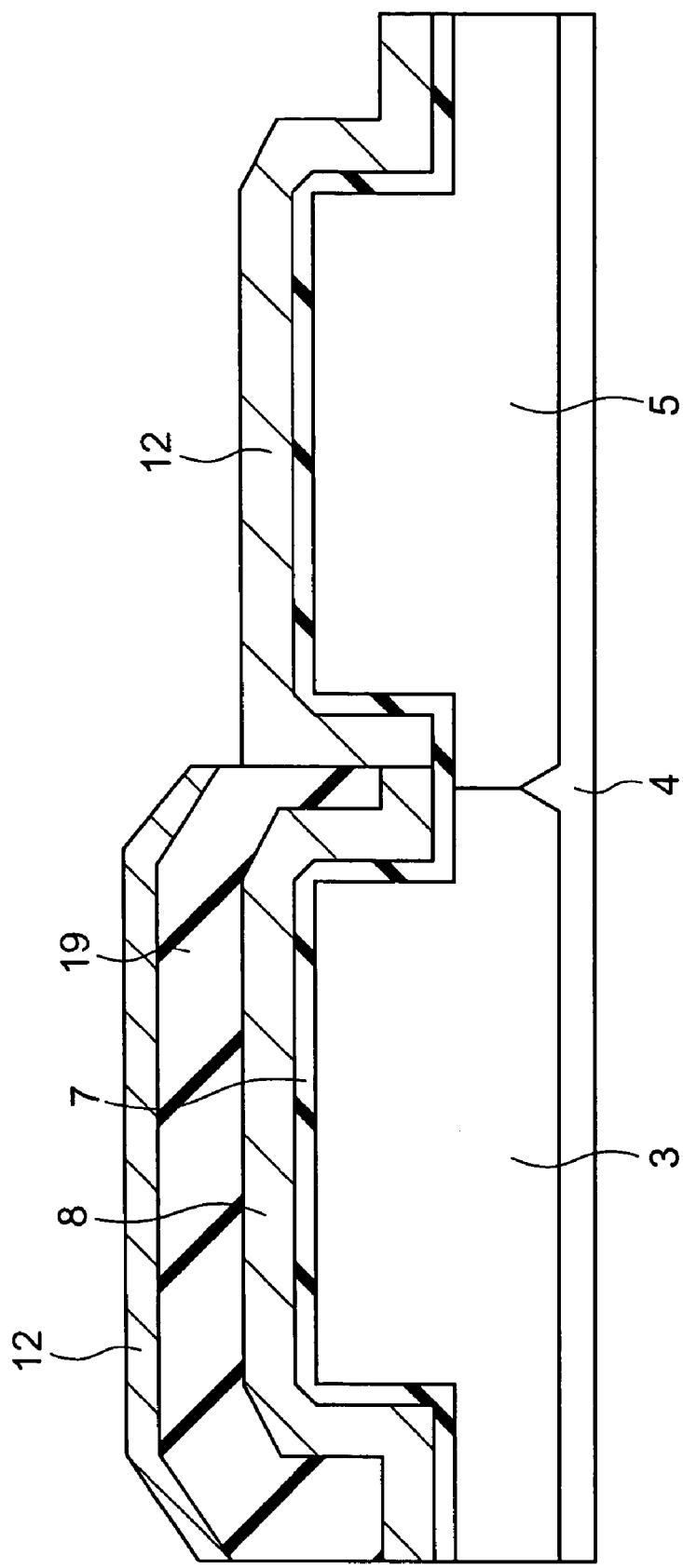
FIG. 22 is a sectional view showing a step of the method of manufacturing a CMOS device according to the second embodiment of the present invention.

Then, as shown in FIG. 22, the n-channel nitrided metal silicide gate electrode 12 is formed on the entire surface. For example, a HfSiN layer having a thickness of 100 nm is formed in this embodiment by performing a simultaneous sputtering from a Hf target and a Si target. It is possible to set the nitrogen content in the HfSiN layer to be about 20% by using $Ar/N_2$ mixture gas at the time of the sputtering and setting the $Ar/N_2$ gas flow ratio to be about 20 to 1. In this embodiment, the Ar flow rate is set to be 80 sccm, and the $N_2$ flow rate is set to be 4 sccm, and the sputtering power is set to be 100 W for Hf, and 100 W for Si, thereby depositing a HfSiN layer having a Hf/Si ratio of 1 to 1, and a nitrogen content of 20 at. %. It is possible to adjust the Hf:Si ratio by adjusting the sputtering power. In this embodiment, it is preferable that the Hf:Si ratio be about 1:1 to 3:5, since with this ratio, the composition of a Hf silicide in HfSiN becomes either HfSi or $HfSi_2$, thereby decreasing the resistance further. The materials of the n-channel nitrided metal silicide that can be used in this invention, i.e., Ti, Zr, and Hf, are related elements in the periodic table of elements, and have substantially the same solid-state properties from a chemical viewpoint. Accordingly, it is possible to form the n-channel nitrided metal silicide gate electrode 12 by using Ti and Zr in a manner similar to that described above.

Figure 23:
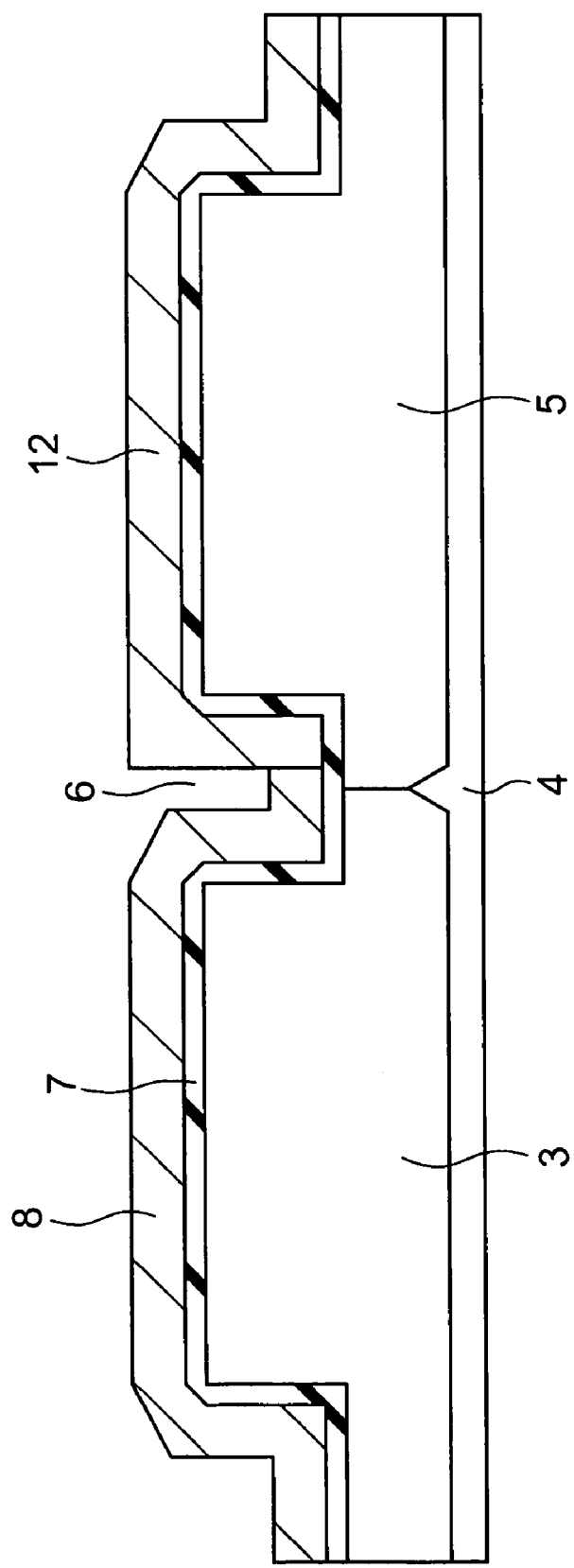
FIG. 23 is a sectional view showing a step of the method of manufacturing a CMOS device according to the second embodiment of the present invention.

Next, the $Si_3N_4$ layer 19 is removed by using heated phosphorous acid solution, thereby obtaining the structure shown in FIG. 23. The HfSiN layer 12 deposited on the $Si_3N_4$ layer 19 is removed during the removing of the $Si_3N_4$ layer 19 due to the lift-off effect. In order to perform the lift-off of the HfSiN layer 12 on the $Si_3N_4$ layer 19 in a secured manner, it is preferable that the thickness of the $Si_3N_4$ layer 19 be more than three times the thickness of the HfSiN layer 12. In this embodiment, the thickness is set to be 300 nm.

Figure 24:
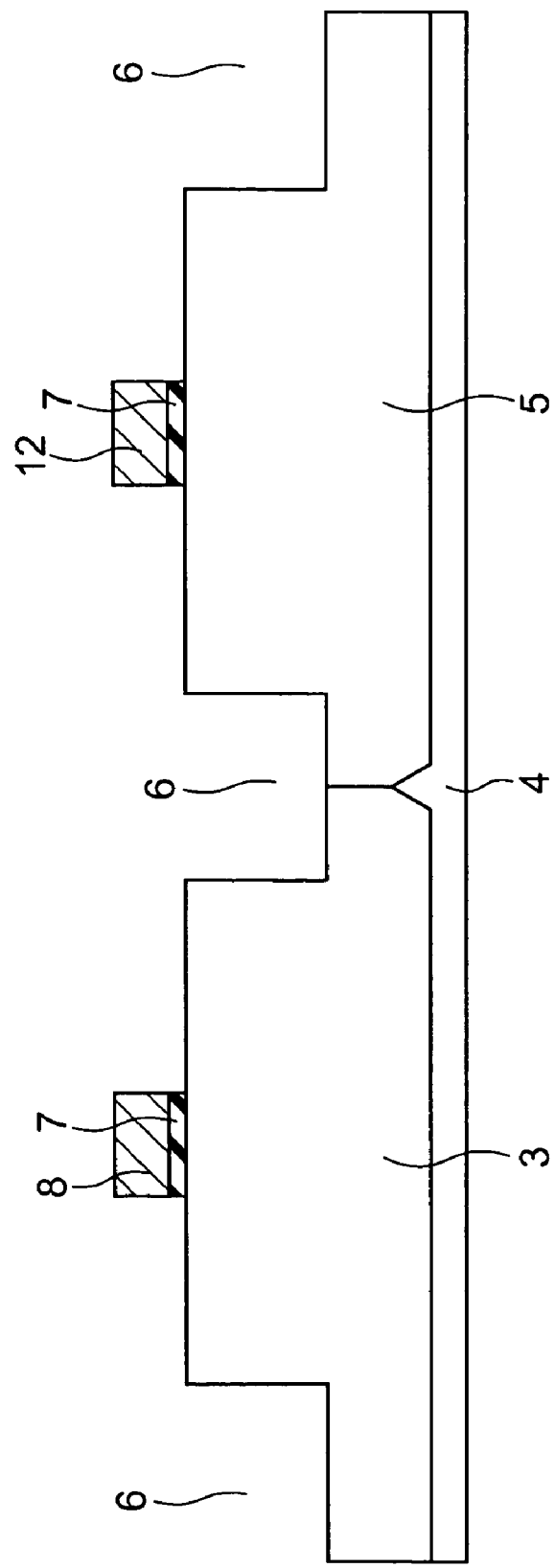
FIG. 24 is a sectional view showing a step of the method of manufacturing a CMOS device according to the second embodiment of the present invention.

Next, as shown in FIG. 24, the shaping of the gate electrode portion is performed by using a normal photolithography technique and etching technique. It is preferable that the processing of the gate electrode and the gate dielectric film be performed by using a physical etching technique such as the Ar ion milling. The reason for this is that since the p-channel nitrided metal silicide gate electrode 8 and the n-channel nitrided metal silicide gate electrode 12 formed of different materials are processed at the same time, a chemical etching mechanism may cause an etching rate error, thereby changing the shape of the p-channel MOSFET and the n-channel MOSFET obtained thereby.

Figure 25:
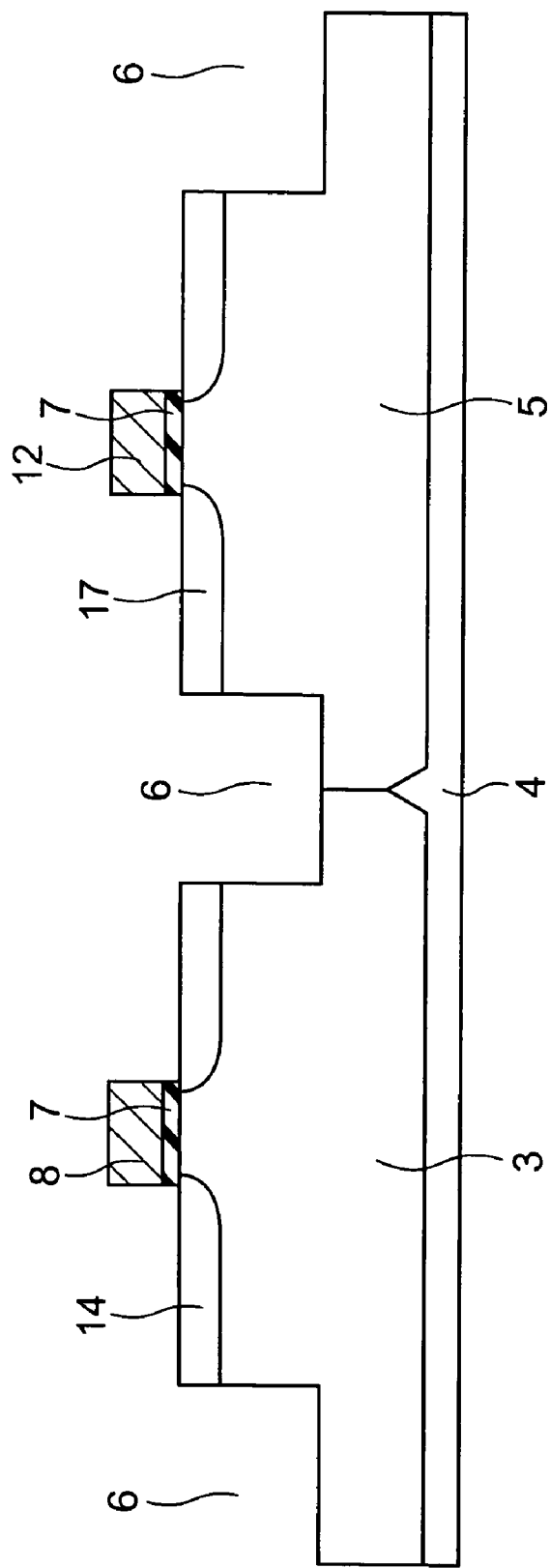
FIG. 25 is a sectional view showing a step of the method of manufacturing a CMOS device according to the second embodiment of the present invention.

Then, ion implantation is performed in a conventional manner, thereby forming the shallow $p^+$ impurity diffusion layers 14 and the shallow $n^+$ impurity diffusion layers 17 as shown in FIG. 25. In this step, the gate electrodes serve as masks during the ion implantation. It has been observed that since the gate electrodes 8 and 12 of this embodiment are partially crystallized, no accelerated ion reaches the Si channel region under the gate electrodes 8 and 12. Of course, during the ion implantation to form the p-channel MOSFET, the n-channel MOSFET is covered by a resist, and during the ion implantation to form the n-channel MOSFET, the p-channel MOSFET region is covered by a resist.

Figure 26:
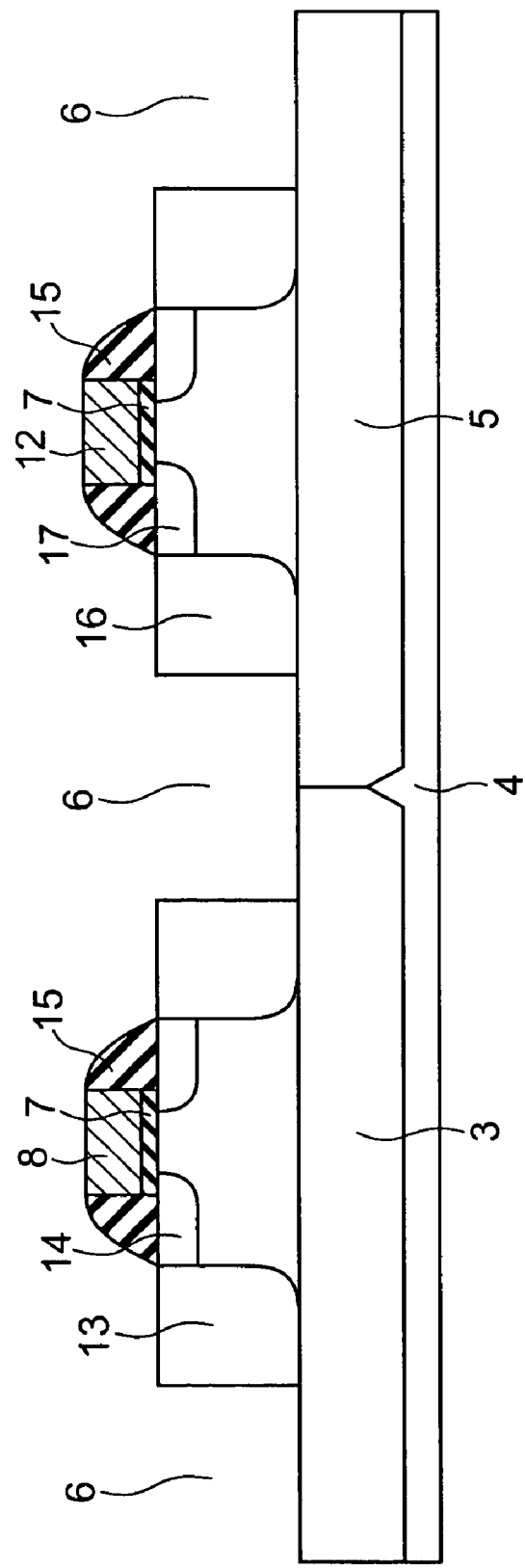
FIG. 26 is a sectional view showing a step of the method of manufacturing a CMOS device according to the second embodiment of the present invention.

Thereafter, as shown in FIG. 26, the gate sidewall 15 is formed in a well-known manner. Subsequently, the deep $p^+$ impurity diffusion layer 13 and the deep $n^+$ impurity diffusion layer 16 are formed by performing an activation heat treatment at a temperature of 900° C. This heat treatment is performed in atmospheric pressure nitrogen with an oxygen partial pressure of $10^{-3}$ Torr or more. After this step, the surface of each nitrogen added metal silicide layer is oxidized to about 1 nm in depth. As the result, the surface is covered by an SiON layer (not shown in the drawing). In this step, during the ion implantation to form the p-channel MOSFET, the n-channel MOSFET is covered by a resist, and during the ion implantation to form the n-channel MOSFET, the p-channel MOSFET region is covered by a resist.

Figure 27:
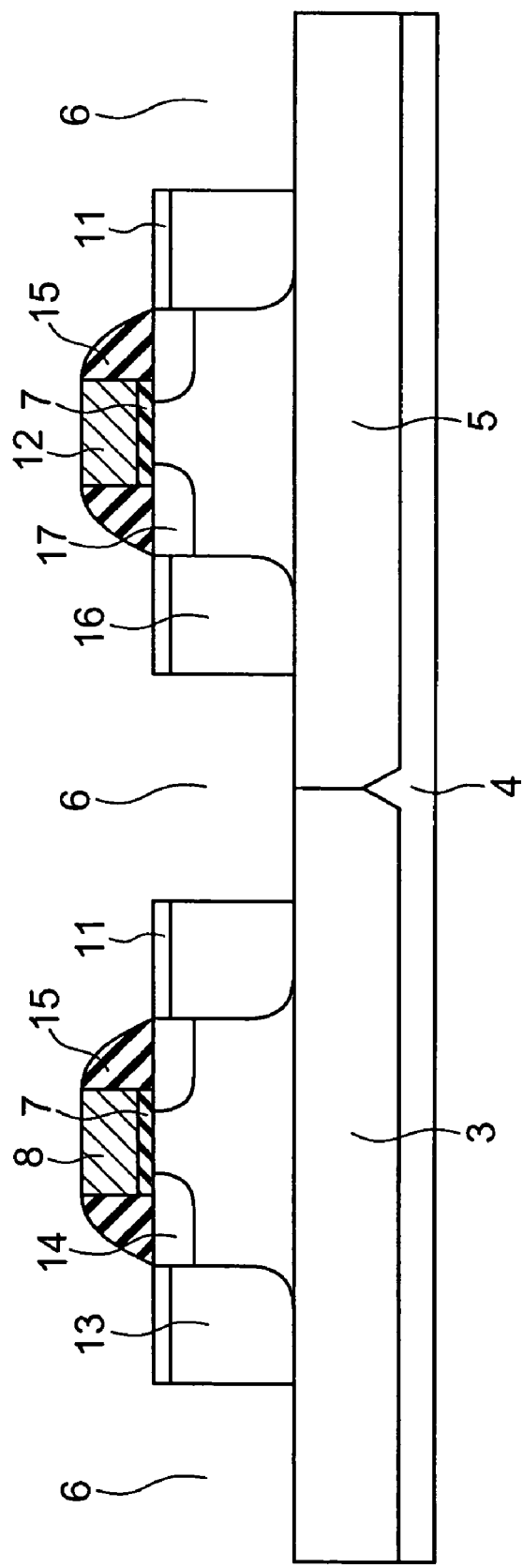
FIG. 27 is a sectional view showing a step of the method of manufacturing a CMOS device according to the second embodiment of the present invention.

Then, as shown in FIG. 27, the salicide layer 11 is formed on each of the $p^+$ impurity diffusion layers 13 and $n^+$ impurity diffusion layers 16. In this embodiment, first a Co/Ti/TiN deposition is performed, then a Co silicide is formed by a heat treatment performed in a conventional manner, and then the Ti/TiN layer is removed by a mixed acid solution containing $H_2SO_4$ and $H_2O_2$. Since the surfaces of the p-channel nitrided metal silicide gate electrode 8 and the n-channel nitrided metal silicide gate electrode 12 are covered by thin SiON layers, which are formed in the previous step, the gate electrodes are not eroded by the mixed acid solution containing $H_2SO_4$ and $H_2O_2$ used to remove the Ti/TiN layer. A usual silicide material may be entirely oxidized by a heat treatment under an oxygen atmosphere at a temperature of 900° C. However, in the case of the nitrogen added metal silicide layers of this embodiment, only part of the surfaces of the layers is oxidized. The reason for this is that the diffusion of oxygen is curbed at the SiON layer, thereby stopping the oxidation at a certain point. Thereafter, a normal device flattening step is performed, thereby completing the manufacturing of the CMOSFET as shown in FIG. 17.

Figure 28:
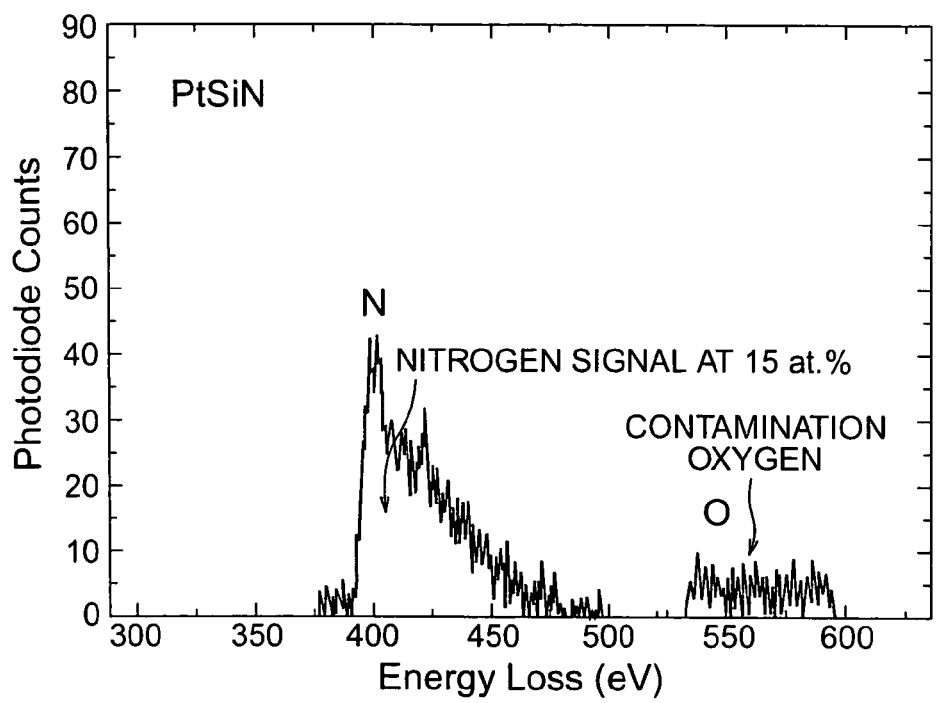
FIG. 28 shows the result of an analysis of nitrogen content of a gate electrode of a p-channel MOSFET manufactured according to the second embodiment of the present invention, the analysis being performed by an EELS analysis method.
Figure 29:
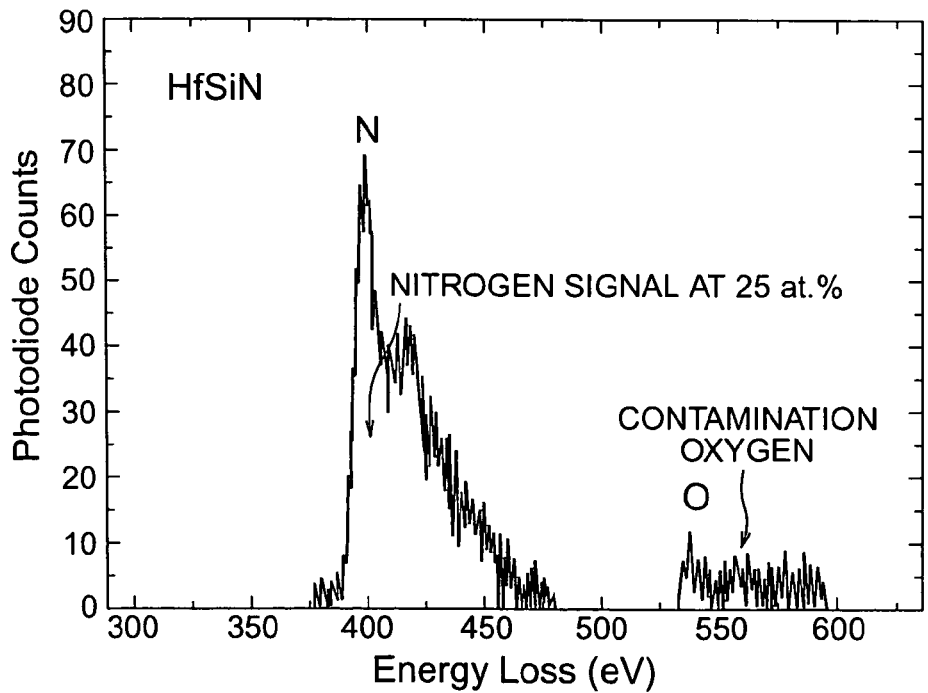
FIG. 29 shows the result of an analysis of nitrogen content of a gate electrode of an n-channel MOSFET manufactured according to the second embodiment of the present invention, the analysis being performed by an EELS analysis method.

In the CMOS device of this embodiment thus manufactured, the fact that nitrogen is contained in the gate electrode portion was confirmed in the following manner. A section of the CMOS device as shown in FIG. 17 was exposed by specimen processing using an FIB (Focused Ion Beam) method, and a composition analysis of the gate electrode portion was performed by EELS (Electron Energy Loss Spectroscopy) using a TEM (Transmission Electron Microscopy) apparatus. The reason why EELS was employed is that this method is suitable for the analysis of light elements such as nitrogen. As shown in FIG. 28, the p-channel gate electrode 8 formed of PtSiN contained 15 at. % of nitrogen. Furthermore, as shown in FIG. 29, the n-channel gate electrode 12 formed of HfSiN contained 25 at. % of nitrogen. Although signals representing oxygen are observed in FIGS. 28 and 29, the reason for the generation of oxygen is the oxidation of the surface of the section of the gate electrodes during the formation of specimens for EELS. The gate electrodes contain no oxygen.

As described above, according to this embodiment, it is possible to manufacture a semiconductor device which has a lower resistance, the device characteristics of which do not vary.

Figure 30:
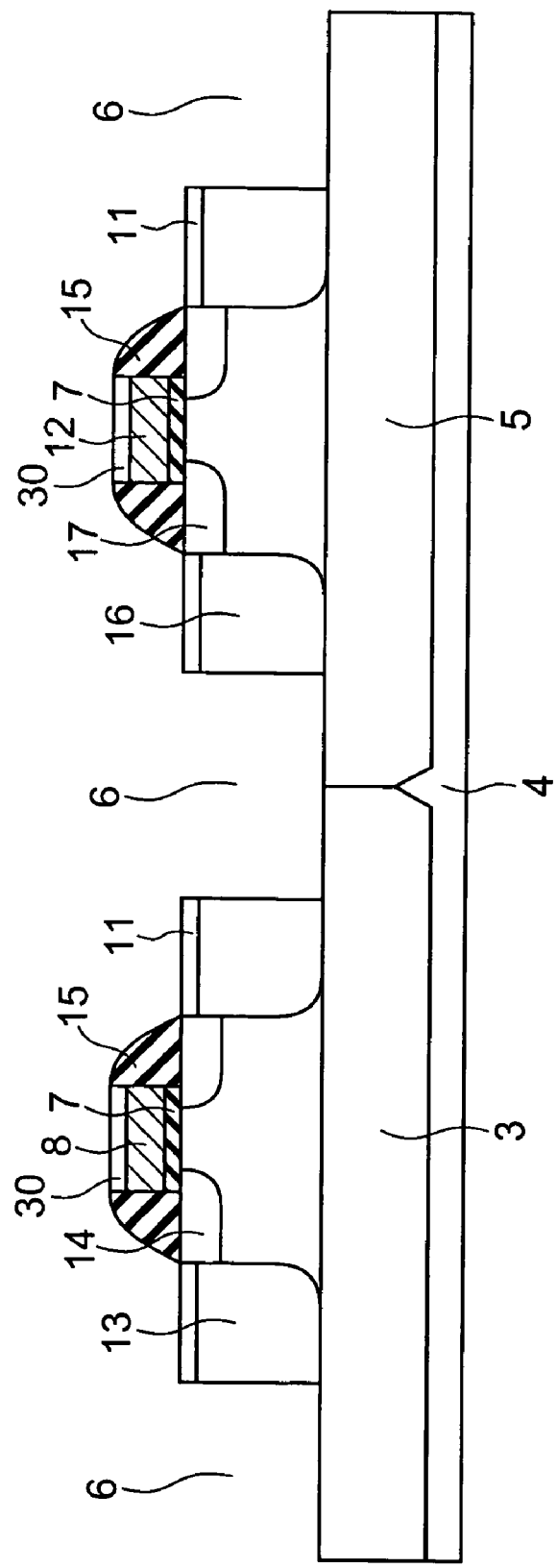
FIG. 30 is a sectional view showing the structure of a CMOS device manufactured according to a first modification of the second embodiment of the present invention.

Before the patterning of the gate electrodes shown in FIG. 24, it is possible to form a layer of Si or SiGe on the nitrided metal silicide gate electrodes 8 and 12. With this step, it is possible to improve the oxidation resistant property in the later steps and the process matching characteristics of the gate electrodes without degrading the characteristics of the partially crystallized nitrided metal silicide gate electrodes. The reason for this is that Si or SiGe is highly resistant to an oxidation atmosphere as compared to a nitrided metal silicide. Accordingly, in this case, the CMOS device manufactured includes a layer 30 of Si or SiGe formed on the nitrided metal silicide gate electrodes 8 and 12, as shown in FIG. 30.

Figure 31:
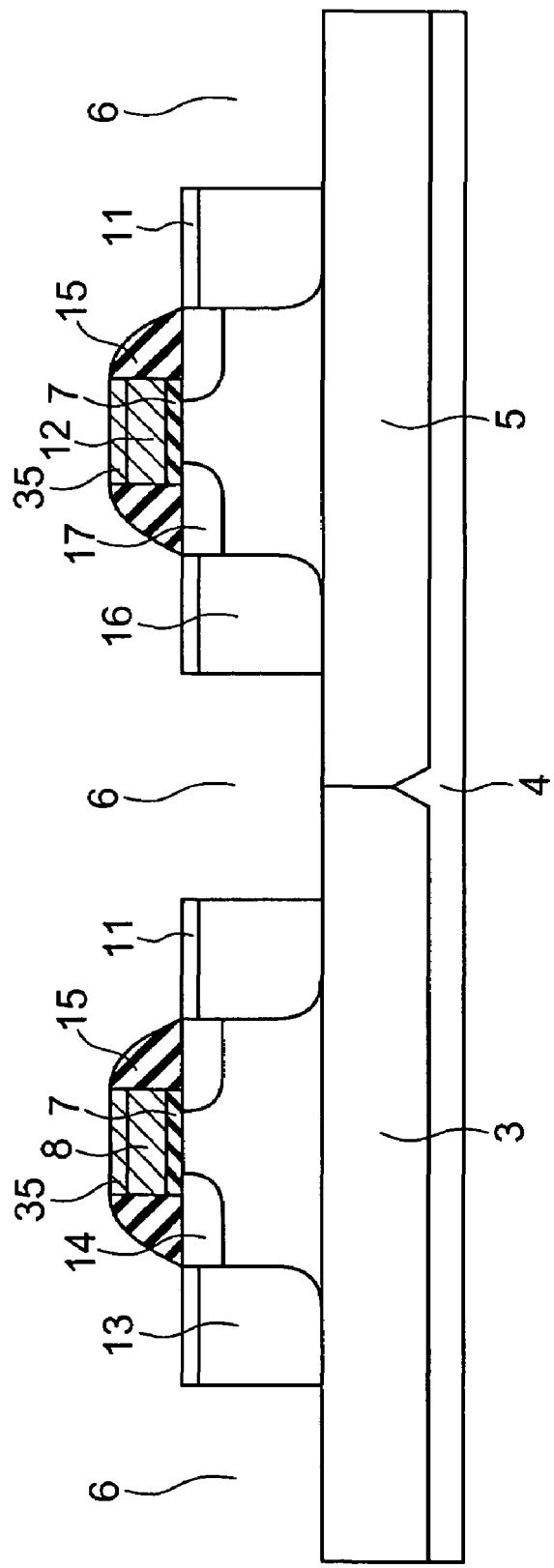
FIG. 31 is a sectional view showing the structure of a CMOS device manufactured according to a second modification of the second embodiment of the present invention.

Furthermore, as shown in FIG. 31, it is possible to form a layer 35 of a metal, a metal silicide, a metal boride, a metal carbide, or a metal nitride, on the nitrided metal silicide gate electrodes 8 and 12. In this case, since a metal, a metal silicide, a metal boride, a metal carbide, or a metal nitride has a lower resistivity than a nitrided metal silicide, it is possible to decrease the resistance of the gate electrodes without degrading the characteristics of the partially crystallized nitrided metal silicide gate electrodes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
   a silicon layer;
   a gate dielectric film formed on the silicon layer;
   a gate electrode formed on the gate dielectric film and including a nitrided metal silicide layer which is partially crystallized; and
   source and drain regions formed in a surface region of the silicon layer at both sides of the gate electrode.

2. The semiconductor device according to claim 1, wherein a metal contained in the nitrided metal silicide layer is selected from the group consisting of titanium, zirconium, hafnium, platinum, palladium, and iridium.

3. The semiconductor device according to claim 2, wherein:
   when the silicon layer is an n-type channel, the nitrided metal silicide layer contains at least one metal selected from the group consisting of titanium, zirconium, and hafnium; and
   when the silicon layer is a p-type channel, the nitrided metal silicide layer contains at least one metal selected from the group consisting of platinum, palladium, and iridium.

4. The semiconductor device according to claim 1, wherein a melting point of a metal contained in the nitrided metal silicide layer is 1,500° C. or more and 2,500° C. or less.

5. The semiconductor device according to claim 1, wherein a nitrogen content of the nitrided metal silicide layer is 15 at. % or more and 30 at. % or less.

6. The semiconductor device according to claim 5, wherein the nitrogen content of the nitrided metal silicide is 17 at. % or more and 29 at. % or less.

7. The semiconductor device according to claim 1, wherein a volume ratio of a crystal region of the nitrided metal silicide layer is 10% or more and 58% or less.

8. The semiconductor device according to claim 1, wherein the gate electrode includes a layer of Si or SiGe formed on the nitrided metal silicide layer.

9. The semiconductor device according to claim 1, wherein the gate electrode includes a layer of a material selected from the group consisting of a metal, a metal silicide, a metal boride, a metal carbide, and a metal nitride, formed on the nitrided metal silicide layer.

10. A semiconductor device comprising:
    an n-channel MOSFET including:
      a p-type silicon layer formed on a first region of a semiconductor substrate;
      a first gate dielectric film formed on the p-type silicon layer;
      a first gate electrode formed on the first gate dielectric film and including a nitrided metal silicide layer which is partially crystallized; and
      n-type first source and drain regions formed in a surface region of the p-type silicon layer at both sides of the first gate electrode, and
    a p-channel MOSFET including:
      an n-type silicon layer formed on a second region of the semiconductor substrate;
      a second gate dielectric film formed on the n-type silicon layer;
      a second gate electrode formed on the second gate dielectric film and including a nitrided metal silicide layer which is partially crystallized; and
      p-type second source and drain regions formed in a surface region of the n-type silicon layer at both sides of the second gate electrode.

11. The semiconductor device according to claim 10, wherein:
    the nitrided metal silicide layer included in the first gate electrode contains at least one metal selected from the group consisting of titanium, zirconium, and hafnium; and
    the nitrided metal silicide layer included in the second gate electrode contains at least one metal selected from the group consisting of platinum, palladium, and iridium.

12. The semiconductor device according to claim 10, wherein a melting point of a metal contained in the nitrided metal silicide layers of the first and second gate electrodes is 1,500° C. or more and 2,500° C. or less.

13. The semiconductor device according to claim 10, wherein a nitrogen content of the nitrided metal silicide layers of the first and second gate electrodes is 15 at. % or more and 30 at. % or less.

14. The semiconductor device according to claim 10, wherein a volume ratio of a crystal region of the nitrided metal silicide layers of the first and second electrodes is 10% or more and 58% or less.

15. The semiconductor device according to claim 10, wherein each of the first and second gate electrodes includes a layer of Si or SiGe formed on the nitrided metal silicide layer.

16. The semiconductor device according to claim 10, wherein each of the first and second gate electrodes includes a layer of a material selected from the group consisting of a metal, a metal silicide, a metal boride, a metal carbide, and a metal nitride, formed on the nitrided metal silicide layer.

* * * * *